United States Patent
Schat et al.

(10) Patent No.: US 10,396,974 B1
(45) Date of Patent: Aug. 27, 2019

(54) SELF-TESTING OF A PHASE-LOCKED LOOP USING A PSEUDO-RANDOM NOISE

(71) Applicant: NXP B.V., Eindhoven (NL)

(72) Inventors: Jan-Peter Schat, Hamburg (DE); Ulrich Moehlmann, Moisburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/041,027

(22) Filed: Jul. 20, 2018

(51) Int. Cl.
*H04L 7/033* (2006.01)
*H04L 25/02* (2006.01)

(52) U.S. Cl.
CPC ........ *H04L 7/0331* (2013.01); *H04L 25/0212* (2013.01)

(58) Field of Classification Search
CPC .......................... H04L 7/0331; H04L 25/0212
See application file for complete search history.

(56) References Cited

U.S. PATENT DOCUMENTS

| | | | |
|---|---|---|---|
| 4,677,676 A | 6/1987 | Eriksson | |
| 5,396,561 A | 3/1995 | Popovich et al. | |
| 5,423,076 A * | 6/1995 | Westergren | H03J 1/0008 331/14 |
| 5,553,153 A | 9/1996 | Eatwell | |
| 5,625,785 A | 4/1997 | Miura et al. | |
| 5,940,519 A | 8/1999 | Kuo | |
| 2009/0268791 A1* | 10/2009 | Waheed | H03L 7/099 375/219 |
| 2017/0194969 A1* | 7/2017 | Amaral | H03L 1/00 |
| 2017/0287461 A1 | 10/2017 | Ku | |

FOREIGN PATENT DOCUMENTS

WO WO2017151736 A1 9/2017

OTHER PUBLICATIONS

Built-in Self-Test for stability measurement of low-dropout regulator, Jae Woong Jeong, Ender Yilmaz, LeRoy Winemberg, Sule Ozev, International Test Conference 2017, paper 1.4, in print.
Wide Bandwidth System Identification of AC System Impedances by Applying Perturbations to an Existing Converter, Daniel Martin, Enrico Santi, Adam Barkley, 2011 IEEE Energy Conversion Congress and Exposition, p. 2549-2556.
Disturbance-free BIST for Loop Characterization of DC-DC Buck Converters, Navankur Beohar; Priyanka Bakliwal; Sidhanto Roy; Debashis Mandal; Philippe Adell; Bert Vermeire; Bertan Bakkaloglu; Sule Ozev, 2015 IEEE 33rd VLSI Test Symposium (VTS), p. 1-6.

(Continued)

*Primary Examiner* — Michelle M Koeth

(57) ABSTRACT

An apparatus includes signal control circuitry, a phase-locked loop (PLL), and a correlation circuit. The signal control circuitry provides a reference clock signal carrying pseudo-random phase noise and as derived from an application clock signal and pseudo-random noise. The PLL, responsive to the reference clock signal carrying the pseudo-random phase noise, provides an output signal that is related to the phase of the reference clock signal. The correlation circuit self-tests the PLL by cross-correlating a signal corresponding to the output signal from the phase detector with the pseudo-random noise and, in response, by assessing results of the cross-correlation relative to a known threshold indicative of a performance level of the PLL.

20 Claims, 12 Drawing Sheets

(56) References Cited

OTHER PUBLICATIONS

Computer-Aided Small-Signal Analysis Based on Impulse response of DC/DC Switching Power Converters D. Maksimovic, IEEE Transactions on Power Electronics, Year: 2000, vol. 15, Issue: 6, p. 1183-1191.
System Identification of Power Converters with digital control through cross-correlation methods, Botao Miao; R. Zane; D. Maksimovic IEEE Transactions on Power Electronics Year: 2005, vol. 20, Issue: 5, p. 1093-1099.
A secondary path modeling technique for active noise control systems, S. M. Kuo; D. Vijayan, IEEE Transactions on Speech and Audio Processing, 1997, vol. 5, Issue: 4, p. 374-377.
System Identification: Theory for the User, Lennard Ljung, online http://een.iust.ac.ir/profs/Poshtan/Ljung%20L%20System%20Identification%20Theory%20for%20User.pdf.
ISO/DIS 26262:2011-2012—Part 11: Guideline on application of ISO 26262 to semiconductors.
Practical Design Considerations for an All-Digital PLL in a Digital Car Radio Reception SoC (Nov. 9-11, 2016).
Eynde, F.O., "On the relationship between the CMRR or PSRR and the second harmonic distortion of perational amplifiers", IEEE Journal of Solid-State Circuits, vol. 24, Issue 6, pp. 1740-1744, 1989.
Van Peteghem, P.M., "On the relationship between PSRR and clock feedthrough in SC filters", IEEE Journal of Solid-State Circuits, vol. 23, Issue 4, pp. 997-1004, 1988.
Sackinger, E., "A general relationship between Amplifier parameters, and its Application to PSRR improvement", IEEE Transactions on circuits and systems, vol. 38, No. 10, Oct. 1991.
Non-final office action dated Nov. 19, 2018 in U.S. Appl. No. 16/008,544.
Notice of Allowance dated Apr. 25, 2019 in U.S. Appl. No. 16/008,544.
Notice of Allowance dated Mar. 26, 2019 in U.S. Appl. No. 16/008,544.

\* cited by examiner

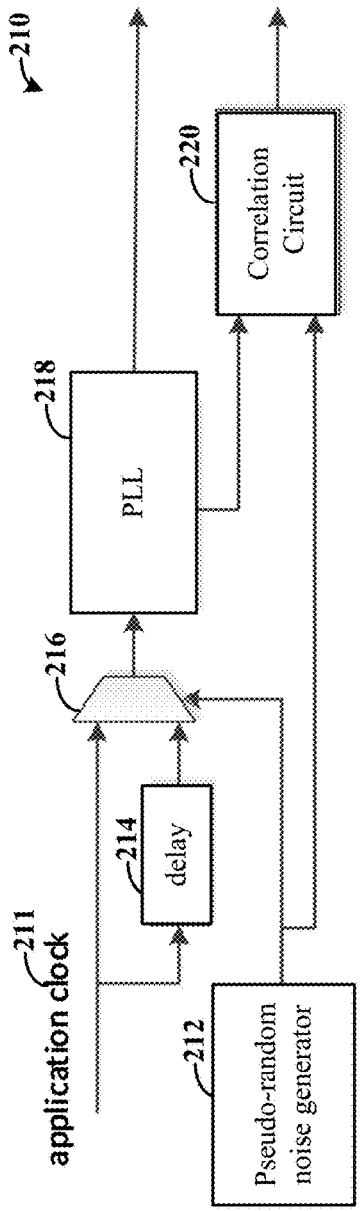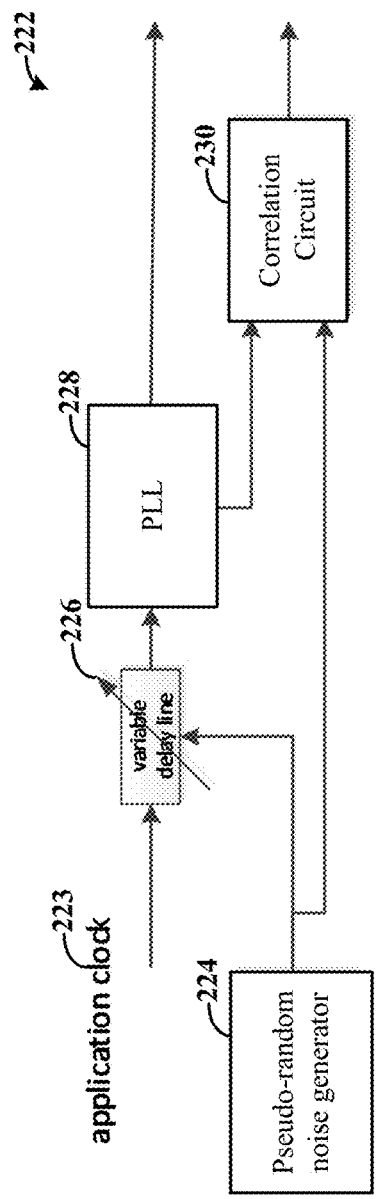

US 10,396,974 B1

SELF-TESTING OF A PHASE-LOCKED LOOP USING A PSEUDO-RANDOM NOISE

OVERVIEW

Aspects of various embodiments are directed to apparatuses and methods thereof related to self-testing a phase-locked loop (PLL) of the apparatus using pseudo-random noise.

PLLs provide control for a variety of applications by generating an output signal related to the phase of one or more input signals. PLL parameters can influence the overall performance of an integrated circuit (IC) and are used for various applications. Some applications can be directed to complying with standards that require PLL parameters to be within various limits, and, in many instances, require the PLL parameters to remain within various limits over the life of the circuit.

These and other matters have presented challenges to self-testing of PLL implementations, for a variety of applications.

SUMMARY

Various example embodiments are directed to issues such as those addressed above and/or others which may become apparent from the following disclosure concerning self-testing one or more phase-locked loop (PLL) parameters of a PLL by adding pseudo-random noise to an input signal of the phase detector of the PLL.

In certain example embodiments, aspects of the present disclosure involve self-testing the PLL of an apparatus subsequent to production testing and/or while the apparatus is in the field. The self-testing can occur at each power-up of the apparatus, at periodic intervals, and/or continuously (e.g., concurrently with the application mode of the apparatus).

In more specific example embodiments, an apparatus includes signal control circuitry, a PLL, and a correlation circuit. The signal control circuitry provides a reference clock signal carrying pseudo-random phase noise. For example, the input application clock signal can be phase modulated to generate the reference clock signal, as input to the PLL, that carries the pseudo-random phase noise. Pseudo-random noise can be generated or can be noise that exists in the system, as further described herein, and can be used to modulate the application clock signal to generate the reference clock signal having or comprising the pseudo-random phase noise. The PLL includes a phase detector that responds to the reference clock signal carrying the pseudo-random phase noise by providing an output signal that is related to the phase of the passed one of the at least two output signals derived from the application clock signal (e.g., generates an output signal that is related to a phase differences between the input signal and the feedback signal of the PLL). The correlation circuit self-tests the PLL by cross-correlating a signal corresponding to the output signal from the phase detector with the pseudo-random noise and by assessing results of the cross-correlation relative to a known threshold indicative of a performance level of the PLL.

In some specific embodiments, the signal control circuitry includes a signal-delay control circuit responds to a control signal carrying the pseudo-random noise and an application clock signal by passing, as the reference clock signal, one of at least two output signals derived from the application clock signal and including at least one output signal being delayed relative to the other of the at least two output signals. The passed signal is the reference clock signal input to the PLL, and includes or carries the pseudo-random phase noise (e.g., the phase is modulated by the pseudo-random noise resulting in a reference signal clock comprising the pseudo-random phase noise). The delayed signal can be provided by the signal delay circuit. The PLL includes a phase detector that responds to the reference clock signal (e.g., the one of at least two output signals from the signal-delay control circuit) by providing an output signal is related to the phase of the passed one of the at least two output signals derived from the application clock signal (e.g., generates an output signal that is related to a phase differences between the input signal and the feedback signal of the PLL).

In various embodiments, the signal delay circuit is integrated with the signal-delay control circuitry. For example, the apparatus can include a variable delay line circuit that integrates the signal delay circuit and the signal-delay control circuit. In other embodiments, the signal delay circuit and the signal-delay control circuit are separate but also cooperative as described below. The signal delay circuit can provide a delayed clock signal, relative to the application clock signal, to the signal-delay control circuit, and the signal-delay control circuit (e.g., a multiplexer) passes one of the output signals derived from one of the application clock and the delayed clock signal as the reference clock signal that is phase modulated by the pseudo-random noise and is input to the PLL (which carries or comprises the pseudo-random phase noise).

The PLL can include the phase detector, a loop filter, an oscillator, and feedback loop. The loop filter filters a phase error signal as output by the phase detector. The phase error signal is proportional to a phase difference of the one of the reference clock signal (e.g., the at least two output signals from the signal-delay control circuit) and a feedback signal from the PLL. The oscillator provides an output responsive to the filtered phase error signal, and the feedback loop, including a feedback divider circuit, provides the feedback signal to the phase detector responsive to the output of the oscillator.

The correlation circuit can derive a PLL impulse response from the cross-correlation and which is used to derive one or more PLL parameters. The PLL impulse response can include the impulse response of the phase error or can be derived directly therefrom. In specific embodiments, the correlation circuit includes at least one summing circuit and a filter circuit used to derive the PLL impulse response from the cross-correlation that is obtained using a folding product of the phase error of the PLL (e.g., output of the phase detector) and the pseudo-random noise. In other embodiments, the correlation circuit includes at least one summing circuit and a filter circuit used to derive an impulse response from a difference of the cross-correlation of the phase error of the PLL and the pseudo-random noise and the autocorrelation of the pseudo-random noise. For example, the correlation circuit can derive an impulse response of the phase error from the cross-correlation of the difference between an input phase and an output phase and the pseudo-random noise and, derives therefrom, the PLL impulse response from a difference between an auto-correlation of the pseudo-random noise and the impulse response of the phase error. The PLL impulse response can be assessed by inverting the difference between the impulse response of the phase error and the auto-correlation of the pseudo-random noise, although embodiments are not so limited.

In accordance with a number of embodiments, the self-testing of the PLL is conducted after production testing, such as when the apparatus is in the field. The self-testing of the PLL can occur concurrently with processing of the application signal, at each power-up of the apparatus, periodically (concurrently or not with processing the application signal), and/or continuously. In some embodiments, such as when the application signal is processed concurrently with the self-testing of the PLL, at least a portion of the pseudo-random phase noise is removed from the output signal as provided as an output from the PLL using a previously generated pseudo-random phase noise. The amount of the previously generated pseudo-random phase noise can be determined (e.g., using the pseudo-random noise) and used to remove the at least a portion of the (next) pseudo-random phase noise. The apparatus, in such example embodiments, can include noise mitigation circuitry used to remove at least a portion of the pseudo-random phase noise from the output of the PLL using a cross-correlation of a previous signal corresponding to another output signal from the phase detector with another control signal carrying pseudo-random noise.

In a number of specific embodiments, one or more actions can be performed based on the self-test. For example, the assessment of the cross-correlation can indicate a circuit failure. In response to the indication of circuit failure, the apparatus performs an action based on the failure, such as rerunning the self-test, providing an error message, rebooting the apparatus, powering the apparatus down, and various combinations thereof.

Further, various specific embodiments can include a number of variations from that described above. For example, the pseudo-random phase noise can have a frequency spectrum and amplitude that (is intended to) dithers the input clock, as further described herein, and/or the PLL includes an all-digital PLL (ADPLL) having a digital loop filter and the phase detector provides a digital signal. In some specific embodiments, whether or not the PLL is locked is determined prior to assessing the PLL. For example, determining whether the PLL is locked or not occurs using the output signal from the PLL and an input signal, and the PLL is self-tested in response to determining the PLL is locked.

In other embodiments, the disclosure is directed to methods of using the circuit-based specific embodiments disclosed herein and including providing a reference clock signal carrying pseudo-random phase noise. For example, the reference clock signal and noise can be combined by providing a control signal carrying the pseudo-random noise and using the control signal for passing one of at least two output signals derived from an application clock signal as the reference clock signal carrying the pseudo-random phase noise (e.g., the application clock signal is modulated with the noise resulting in the reference clock signal that comprises or otherwise carries the pseudo-random phase noise). The method can further include self-testing the PLL by cross-correlating a signal corresponding to the output signal from the phase detector with the pseudo-random noise and, in response, assessing the results of the cross-correlation relative to a known threshold indicative of a performance level of the PLL.

The cross-correlation can be used to determine one or more PLL parameters. For example, the method can include self-testing the PLL by calculating a phase margin using the cross-correlation. For example, using the impulse response, as derived from the cross-correlation, phase margin is calculated and compared to the known threshold, the known threshold being indicative of at least one of a phase margin limit and a previously calculated phase margin. In response to the comparison or assessment being indicative of a circuit failure, the method can include performing an action based on the failure, the action being selected from the group consisting of providing an error message, rebooting the apparatus, powering the apparatus down, and a combination thereof. In various specific embodiments, the method includes processing an application signal while the PLL is concurrently providing the output signal having the phase that is related to the phase of the passed one of the at least two output signals derived from the application clock signal.

As another specific embodiment, the phase transfer function can be determined from the cross-correlation and at least one component of the PLL is trimmed responsive to the determined phase transfer function. From the phase transfer function, one or more PLL parameters or the phase error transfer function can be derived.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIGS. 2A-2B illustrate example apparatuses, in accordance with the present disclosure;

Figure 1:
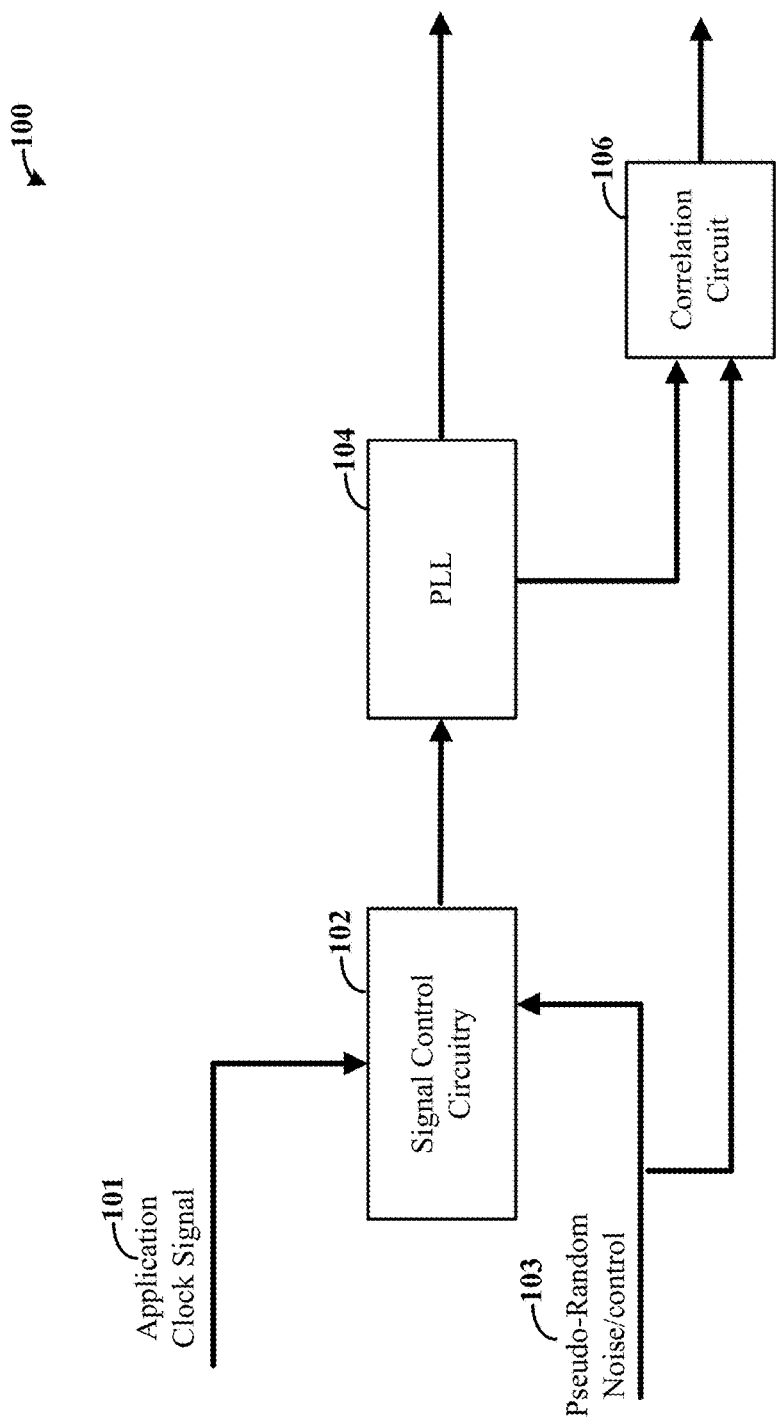
FIG. 1 illustrates an example apparatus, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving self-testing of a phased-locked loop (PLL) by combining a pseudo-random noise with an input signal of the PLL. In certain implementations, aspects of the present disclosure have been shown to be beneficial when used in the context of adding the pseudo-random noise to a control signal used to switch an input of the PLL between an application clock signal and one or more delayed clock signals. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

PLLs are circuits that generate an output signal with a phase that is related to the phase of the input signal, e.g., the reference clock signal. A PLL can be used to maintain a well-defined phase, and hence frequency, relation between two input sources. PLLs can have an oscillator that constantly adjusts to match the frequency of an input reference clock signal. Example PLLs can be used to generate, stabilize, modulate, demodulate, filter and/or recover a signal from noisy communication channels where data may have been corrupted. PLL parameters can influence the overall performance of an integrated circuit. For example, glitches of the reference clock signal or a brown-out can cause malfunctions of the PLL or system lock-out which can be beneficial to detect. For safety-sensitive integrated circuits and other applications, such as in automobiles, it can be beneficial to measure one or more PLL parameters during the lifetime of the apparatus as performance parameters can change over time due to defects and/or aging of circuitry.

Embodiments in accordance with the present disclosure are directed to apparatuses and methods for self-testing the PLL using a built-in self-test (BIST). The BIST can be used to measure one or more PLL parameters by adding a pseudo-random noise to an input signal of the PLL, such as a reference clock signal (e.g., reference phase input or reference frequency input) that is phase modulated via pseudo-random noise, as further described herein. The PLL is self-tested by cross-correlating the pseudo-random noise with the output signal of the phase detector of the PLL. The result of the correlation allows for calculating the impulse response of the phase error, which can be interchangeably referred to as the impulse response at the phase detector output with respect to the phase of the input, and which can be used to calculate phase margin and other PLL parameters.

The impulse response of the phase error can be correlated with the output response of the PLL (e.g., impulse response of the system or PLL impulse response). For example, the impulse response of the phase error is the sum of the negative impulse response of the system and a Dirac pulse, and thus the spectrum of the impulse response of the phase error and the PLL impulse response are similar and can be used to characterize the system. Self-testing the PLL can be performed at each power-up of the apparatus, periodically, or continuously (e.g., concurrent with the application mode). Self-testing concurrently with the application mode can allow for detection of spurious faults, sometimes referred to as Single Event Upsets (SEUs). Some standards can mandate detection of SEUs and/or mandate proving a sufficient diagnostic coverage of SEUs. The self-testing of the PLL, as further described herein, can provide for a straightforward manner of providing diagnostic coverage.

An apparatus in accordance with various embodiments includes signal control circuitry, a PLL, and correlation circuit. The signal control circuit is used to provide a reference clock signal carrying pseudo-random phase noise, such as by modulating the clock signal with pseudo-random noise. For example, the pseudo-random noise is used to modulate the clock signal, which results in the reference clock signal that comprises the pseudo-random phase noise. The PLL, which includes a phase detector, responds to the reference clock signal carrying the pseudo-random phase noise, by providing an output signal (e.g., a phase error signal) that is related to the phase of reference clock signal (and a feedback signal provided to the PLL). The correlation circuit self-tests the PLL by cross-correlating a signal corresponding to the output signal from the phase detector (e.g., the phase error signal or phase difference signal) with the pseudo-random noise, and in response, by assessing results of the cross-correlation relative to a known threshold indicative of a performance level of the PLL, as further described herein.

The signal control circuitry can include a signal delay circuit and signal-delay control circuit, in specific embodiments. The signal delay circuit can be integrated with the signal-delay control circuit or include a different circuit, in various embodiments. The signal delay circuit provides a delayed signal, relative to the application clock signal, to the signal-delay control circuit. The signal-delay control circuit, as further illustrated herein, can include a multiplexer and/or a variable-delay line (which integrates the signal delay circuit). The signal-delay control circuit passes one of at least two output signals derived from the application clock signal as the reference clock signal that is input to the PLL. The passed reference clock signal includes the application clock signal or at least one output signal that is delayed relative to the other of the at least two output signals to the PLL based on a control signal carrying the pseudo-random noise. In some embodiments, a multiplexer is used to pass either the application clock signal or an output signal that is delayed relative to the application clock signal based on the control signal carrying the pseudo-random noise. In other embodiments, a variable-delay line is used to output the application clock signal or one of a plurality of delayed signals based on the control signal carrying the pseudo-random noise (and which is used to select the delay path). The pseudo-random noise is thereby used to modulate the application clock signal by the signal control circuitry, which outputs the reference clock signal carrying the pseudo-random phase noise. More specifically, the signal control circuitry modulates the application clock signal with the pseudo-random noise, which results in modulation of the phase of the application clock signal (e.g., modulations of the zero crossing of the signal) to generate the reference clock signal carrying or comprising the pseudo-random phase noise. The control signal select the reference clock signal from the application clock signal or one of the delayed signals, and the resulting reference clock signal carries the pseudo-random phase noise.

In specific embodiments, the PLL can include the phase detector, a loop filter, an oscillator, and a feedback loop. The phase detector generates an output signal (e.g., an output voltage, an output current, or an output digital signal, such as a digital word as further described herein) that is proportional to (or otherwise indicative of) the phase difference between its inputs, which can be referred to as the phase error signal or phase difference signal. The first input is the reference clock signal that is dependent on the control signal (e.g., used to switch between the application clock signal and one or more delayed clock signals). The reference clock signal carries the pseudo-random phase noise, as described above. The second input is related to the output of oscillator. The loop filter filters the phase error signal as output by the phase detector. As described above, the phase error signal can be proportional to a phase difference of the reference clock signal and a feedback signal from the PLL. The oscillator provides an output signal responsive to the filtered phase error signal, e.g., by generative oscillating electronic signals. The feedback loop provides the feedback signal to the phase detector responsive to the output signal of the oscillator. The feedback loop can include a feedback divider circuit that divides the output signal of the oscillator.

As described above, self-testing of the PLL, in specific embodiments, can include phase modulating an application clock signal using pseudo-random noise to generate the reference clock signal that comprises or carries the pseudo-random phase noise. For example, the reference clock signal can be generated by providing a control signal that combines pseudo-random noise with the control signal of an apparatus. The pseudo-random noise can be generated via a noise generation circuit of the apparatus and mixed with (e.g., used to phase modulate) the input signal of the PLL by switching (depending on the noise signal) between the application clock signal and delayed, phase shifted version of the application clock signal. The control signal is used to pass one of at least two output signals derived from the application clock signal and including at least one output signal delayed relative to the other of the least two output signals as the reference clock signal which comprises the pseudo-random phase noise. For example, the control signal is provided to the signal-delay control circuit and used to selectively pass one of at least two output signals to the PLL that is phase modulated by the pseudo-random noise, e.g., as the reference clock signal of the PLL that carries the pseudo-random phase noise. The PLL responds to the passed output signal from the signal-delay control circuit (e.g., the reference clock signal) by providing an output signal that is related to the phase of the reference clock signal derived from the application clock signal. The PLL can provide the output signal indicative of a phase difference of a feedback signal from the PLL and the passed one of at least two output signals. The method further includes cross-correlating a signal corresponding to the output signal from the phase detector with the pseudo-random noise, and in response, by assessing the results of the cross-correlation relative to a known threshold indicative of a performance level of the PLL.

In specific embodiments, the cross-correlation circuit can derive a PLL impulse response from the cross-correlation. The PLL impulse response can be related to the impulse response of the phase error (e.g., impulse response at the phase detector output). For example, the impulse response of the phase error can be used directly as the PLL impulse response (e.g., impulse response of the system) or can be used to derive the PLL impulse response. In some embodiments, the correlation circuit can include at least one summing circuit and a filter circuit that derives the PLL impulse response from a cross-correlation obtained using a folding product of the phase error of the PLL (e.g., the output from the phase detector) and the pseudo-random noise. In other embodiments, the correlation circuit includes at least one summing circuit and a filter circuit, and derives the PLL impulse response from difference of the cross-correlation of the phase error of the PLL and the pseudo-random noise and the auto correlation of the pseudo-random noise. In various embodiments, the cross-correlation results can be optionally inverted (e.g., subtracting the auto-correlation from the cross-correlation result and inverting), however, embodiments are not so limited.

In accordance with a number of embodiments, the self-testing of the PLL is conducted after production testing, such as when the apparatus is in the field. Self-testing the PLL can occur concurrently with processing of the application signal. The self-testing can occur at each power-up of the apparatus, periodically, and/or continuously. In some embodiments, such as when the application signal is processed concurrently with the self-testing of the PLL, at least a portion of the pseudo-random phase noise can be removed from the output signal of the PLL as provided as an output from the apparatus (e.g., the output application clock signal) using a previously generated pseudo-random phase noise. The amount of the previously generated pseudo-random phase noise can be determined and used to remove the at least portion of the pseudo-random phase noise at the output.

In various embodiments, the cross-correlation can be used to determine one or more PLL parameters. Example PLL parameters include phase transfer function, phase error transfer function, phase margin of the PLL, identifying whether the PLL is locked, damping, natural frequency, among other parameters. For example, the cross-correlation is used to determine the PLL impulse. Using the impulse response, phase margin can be determined. As further described herein, the phase error may be processed directly as the PLL impulse response (e.g., system impulse response), such as for PLLs having high-pass characteristics, or the PLL impulse response can be derived from the impulse response of the phase error, such as for PLLs having low-pass characteristics. As a specific example, the cross-correlation is used to derive the PLL impulse response (either directly from the impulse response of the phase error or derived therefrom), and the PLL impulse response is then used to calculate a phase margin of the PLL. The phase margin is compared to a known threshold that is indicative of at least one of a phase margin limit and previously calculated phase margin. In response to the comparison being indicative of circuit failure, the apparatus can perform one or more actions, as describe further below.

In a number of specific embodiments, one or more actions can be performed based on the self-testing of the PLL in response to the assessment indicating a circuit failure. In response to the indication of circuit failure, the apparatus can perform an action, such as rerunning the self-test, providing an error message, rebooting the apparatus, powering the apparatus down, and various combinations thereof.

Turning now to the figures, FIG. 1 illustrates an example apparatus, in accordance with the present disclosure. The apparatus 100 can self-test a PLL 104 that forms part of the apparatus 100 using a pseudo-random noise 103 for determining a PLL impulse response and/or a phase margin which is used to assess the performance level of the PLL 104.

As illustrated, the apparatus 100 includes signal control circuitry 102, the PLL 104, and a correlation circuit 106. The signal control circuitry 102 can include one or more circuits for providing a reference clock signal (as input to the PLL 104) carrying pseudo-random phase noise. The reference clock signal can carry and/or comprise the pseudo-random phase noise by using a delay line, a phase modulator, and/or adding the noise to a digital reference clock signal. In the above described embodiments, the application clock signal is phase modulated by the pseudo-random noise 103 to generate the reference clock signal carrying the pseudo-random phase noise. The noise can be generated, such as by a pseudo-random noise generator circuit, or can be real noise that exists in the apparatus 100, such as noise derived from a resistor and/or diode by means of an amplifier.

In some specific embodiments, the signal control circuitry 102 includes signal delay circuitry that combines a control signal with the pseudo-random noise 103 and passes one of at least two output signals as the reference clock signal carrying the pseudo-random phase noise, and in response to the control signal carrying the pseudo-random noise 103 and an application clock signal 101. The control signal is used, in this context, to select between output signals and pass the selected signal as a reference clock signal to the PLL 104. The reference clock signal, such as a reference frequency signal or reference phase signal, carries the pseudo-random phase noise. The pseudo-random noise 103 is used to modulate the application clock signal 101 by the signal control circuitry 102. More specifically, the signal control circuitry 102 modulates the application clock signal 101 with the pseudo-random noise 103, which results in the modulation of the phase of the application clock signal (e.g., modulations of the zero crossing of the signal) and generation of the reference clock signal carrying or comprising the pseudo-random phase noise.

In various embodiments, signal control circuitry 102 can include a signal delay circuit and signal-delay control circuit (e.g., a multiplexer (MUX)). The signal-delay control circuit can pass one of two output signals as a reference clock signal input to the PLL 104 responsive to the control signal. The first output signal is derived from or includes the application clock signal 101 and the second output signal is delayed relative to the application clock signal 101. In other embodiments, the signal delay circuitry is a variable delay line that integrates both the signal delay circuit and signal-delay control circuit. The variable delay line can pass one of a plurality of output signals responsive to the control signal carrying the pseudo-random noise 103. A first output signal is derived from or includes the application clock signal 101 and the remaining plurality have different delays relative to the application clock signal 101. The signals having different delays relative to the application clock signal 101 are sometimes herein referred to as delayed clock signals, for ease of reference. The pseudo-random noise 103 can be used to phase modulate the input signal of the PLL 104, e.g., the reference clock signal as input to the PLL 104. As may be appreciated, the output from the signal delay circuitry, responsive to a control signal which may be carrying the pseudo-random noise, is provided to the linear system that includes the PLL 104.

The phase detector of the PLL 104 responds to the phase of the input reference clock signal, e.g., which can be modulated by the pseudo-random noise 103, by outputting the phase error signal. Both the output of the phase detector of the PLL and the pseudo-random noise 103 are input to the correlation circuit 106. In some specific embodiments, the control signal carrying the pseudo-random noise 103 is used to switch between the application clock signal 101 and the one or more delayed clock signals which is provided to the phase detector of the PLL 104 as the reference clock signal (sometimes referred to as the application clock input and that includes a modulated signal, e.g., comprises the pseudo-random phase noise). As further described herein, the output of the phase detector of the PLL 104 can be cross-correlated with the pseudo-random noise to derive the PLL impulse response with respect to the phase of the input to the PLL 104. The PLL impulse response can be directly derived by the cross-correlation which includes or is indicative of an impulse response of the phase error or can be used to derive the PLL impulse response, among other PLL parameters.

More specifically, the PLL 104 responds to reference clock signal (e.g., the passed output signal) from the signal control circuitry 102 by providing an output signal related to the phase of the reference clock signal (e.g., the passed output signal derived from the application clock signal and as modulated by the pseudo-random noise 103). As previously described, the PLL 104 can include a phase detector, a loop filter, an oscillator, and a feedback loop. The phase detector outputs the phase error signal or phase difference signal. The phase error signal includes or is based on a difference of phases of the inputs to the phase detector (e.g., the passed output signal/reference clock signal and feedback signal) and is proportional to the phase error of the PLL (e.g., a phase difference of the one of the at least two output signals from the signal-delay control circuit and a feedback signal from the PLL). The loop filter filters the phase error signal as output by the phase detector. The oscillator provides an output responsive to the filtered phase error signal. For example, the oscillator creates an output phase which is provided as an application clock output and feedback to the phase detector. The oscillator can include a voltage controlled oscillator (VCO), a current controlled oscillator (CCO), a digitally controlled oscillator (DCO), among other types of oscillators. The feedback loop provides the feedback signal to the phase detector responsive to the output of the oscillator. The feedback loop can include a feedback divider circuit that divides the output of the oscillator, and provides the feedback signal (e.g., divided version of the oscillator output signal) as negative feedback to the phase detector.

The pseudo-random noise 103 and the output from the phase detector are provided as inputs to the correlation circuit 106. The correlation circuit 106 cross-correlates the two inputs provided, e.g., the pseudo-random noise 103 and the phase error signal or phase difference signal. In response, the correlation circuit 106 assesses the results of the cross-correlation relative to a known threshold indicative of a performance level of PLL 104. In specific embodiments, the correlation circuit 106 self-tests the PLL 104 by cross-correlating a signal corresponding to the output signal from the phase detector with the pseudo-random noise 103 and, in response, assesses the results of the cross-correlation relative to a known threshold indicative of a performance level of the PLL 104.

The cross-correlation can be defined as:

$$r_{xy}(\tau) = \int_{-\infty}^{\infty} x(t)y(t+\tau)dt$$

With x(t) and y(t) being the two signals to be correlated, and a is the delay between the two signals. For time-discrete signals, the cross-correlation can be expressed by:

$$r_{xy}(m) = \sum_{n=1}^{\infty} x(n) * y(n+m)$$

If x(t) is pseudo-random noise 103 (e.g., from a noise generator) that is fed to the input of a linear system (e.g., the signal control circuitry 102/PLL 104), and y(t) is the output of this linear system (e.g., the phase detector of the PLL 104 and/or output of the PLL 104), then $r_{xy}(t)$ is the impulse response of the linear system. The impulse response of the phase error (e.g., impulse response at the phase detector output) can be directly evaluated as the PLL impulse response of the PLL 104 in some embodiments, and in other embodiments, can be used to derive the PLL impulse response (e.g., impulse response of the system). For example and as further illustrated herein, the impulse response of the phase error is the sum of the negative impulse response of the system and a Dirac pulse, and thus the spectrum of the impulse response of the phase error and at the output of the PLL 104 are similar and can be used to characterize the system. The PLL impulse response/the impulse response of the phase error can be evaluated in the time domain to derive the phase margin of the linear system under consideration, namely the PLL 104. It can also be Fourier-transformed to analyze the linear system in the frequency domain.

More specifically, for a PLL 104, the cross-correlation can be of the pseudo-random noise 103 and the output signals, with the output being from the PLL 104 (e.g., the output phase). The cross-correlation derives the PLL impulse response. In order to provide such a cross-correlation, a phase demodulation can be applied to the output phase, which may not be available directly. A PLL provides an output signal, such as a rectangular clock or a sine wave of which the phase is to be determined by a phase demodulator, e.g., for instance, the argument of the sine-function. As this may not be directly available, embodiments in accordance with the present disclosure use the output of the phase detector of the PLL 104 which provides the phase error signal for the cross-correlation. In some specific embodiments, from the results of the cross-correlation between the phase error and the pseudo-random noise 103, the autocorrelation of the pseudo-random noise is subtracted to provide the PLL impulse response (as if a phase demodulator has been used). The method does not require a phase demodulator and provides the impulse response which is the system response in a quite elegant manner since it saves a lot of electronic circuitry. In other embodiments, the impulse response of the phase error is used as the system response of the PLL.

In accordance with the above, various embodiments are directed to cross-correlation while the linear system is processing application signals by adding or mixing the pseudo-random noise 103 with the application clock signal 101 by switching, depending on the control signal carrying the pseudo-random noise 103, between the application clock signal 101 or the one or more delayed, phase shifted versions of the application clock signal 101. Because the application signal of the PLL 104 is not correlated to the pseudo-random noise 103, it does not influence the result of the cross-correlation and parameter estimation of the PLL 104 can be done during the application mode. In such embodiments, care is taken such that the noise is mitigated or prevented from influencing the application. For example, the phase shift, such as to the delay line, can be small enough to not have an impact to the overall performance of the PLL 104 (e.g., phase noise performance) but large enough to permit valid correlation. If the additional noise is not tolerable in the application, then the noise can be added during dedicated self-test intervals, when the application is switched off. Alternatively, as is further illustrated and described below, the added pseudo-random noise 103 can be subtracted from the output of the PLL 104.

As described above, the impulse response of the phase error (e.g., output from the phase detector) can be processed directly as the system response of the PLL 104, which is sometimes interchangeably referred to herein as the PLL impulse response, or can be used to derive the system response of the PLL 104. The phase error impulse response is derived such that the phase error is correlated with the input signal.

$$r_{xy}(m) = \sum_{n=1}^{\infty} x(n) \cdot y(n+m)$$

For example, the impulse response of the phase error can be calculated based on:

$$h_e(f) = 1 - h(f) \rightarrow ht_e(t) = \delta(t) - ht(t)$$

wherein δ(t) is provided by a Dirac delta pulse. The phase transfer function (e.g., output signal of the PLL as a function of the input) can be defined as:

$$h(s) = \frac{\varphi_{out}}{\varphi_{in}}$$

wherein $\varphi_{out}$ is the phase of the output signal and $\varphi_{in}$ is the phase of the input reference clock signal (e.g., input application clock signal). The phase error transfer function can be defined as:

$$h_e(s) = \frac{\varphi_e}{\varphi_{in}}$$

where $\varphi_e$ is the output of the phase detector, e.g., $\varphi_{in}-\varphi_{out}$ and the phase error transfer function can be redefined as:

$$h_e(s) = \frac{\varphi_{in} - \varphi_{out}}{\varphi_{in}} = 1 - \frac{\varphi_{out}}{\varphi_{in}} = 1 - h(s)$$

and wherein the system response of the PLL includes:

ImpulseResponse $g(t)$=Inverse Laplace Transform $(h(s)\cdot 1)=ht(t)$ and the impulse response of the phase error includes:

$ht_e(t)=\delta(t)-ht(t)$

In case phase error is processed directly as system response, the output signal is seen as folding product between the impulse response of the phase error and the input signal, namely, the pseudo-random noise 103, such as by:

$$r_{xy}(m) = \sum_{n=1}^{\infty} x(n) \cdot y_e(n+m)$$

$$= \sum_{n=1}^{\infty} x(n) \cdot \sum_{l=1}^{\infty} x(l) \cdot h_e(l-n-m)$$

$$= \sum_{l=1}^{\infty} \sum_{n=1}^{\infty} x(n) \cdot x(l) \cdot h_e(l-n-m)$$

$$= \sum_{l=1}^{\infty} \sum_{n=1}^{\infty} x(n) \cdot x(l+n+m) \cdot h_e(l)$$

$$= \sum_{l=1}^{\infty} r_{xx}(l+m) \cdot h_e(l)$$

$$= \sum_{n=1}^{\infty} r_{xx}(m-n) \cdot h(-n)$$

$$= h_e(-m) \rightarrow h_e(m)$$

which is sometimes herein referred to as "method one." Accordingly, the impulse response of the phase error is derived from the cross-correlation result of folding the output of the phase detector with the pseudo-random noise which is used to modulate the input reference (or application) clock signal. Folding is a mathematical operation of signal theory where two signals are multiplied with a certain delay and integrated. The impulse response can be inverted in some embodiments, however, embodiments may not include inversion as the spectrum is the same.

In the example provided above, in which the phase error is processed directly as the system response, the PLL impulse response is derived from the cross-correlation as the folding product between (the impulse response of the) phase error and the input signal (e.g., the pseudo-random noise). The correlation circuit as further illustrated herein can include a multiplier, a summing circuit and a filter circuit that derives the PLL impulse response from the cross-correlation obtained using the folding product of the phase error of the PLL and the pseudo-random noise. For example, the shape of the impulse response can be used to assess performance of the PLL.

In other embodiments, the cross-correlation is calculated from the difference between input and output phase and the pseudo-random noise resulting in:

$$r_{xy}(m) = \sum_{n=-\infty}^{\infty} x(n) \cdot y_e(n+m)$$

$$= \sum_{n=-\infty}^{\infty} x(n) \cdot (x(n+m) - y(n+m))$$

$$= \sum_{n=-\infty}^{\infty} x(n) \cdot \left( x(n+m) - \sum_{l=-\infty}^{\infty} x(l) \cdot h(l-n-m) \right)$$

$$= \sum_{n=-\infty}^{\infty} x(n) \cdot x(n+m) - \sum_{l=-\infty}^{\infty} \sum_{n=-\infty}^{\infty} x(n) \cdot x(l) \cdot h(l-n-m)$$

$$= r_{xx}(m) - \sum_{l=-\infty}^{\infty} \sum_{n=-\infty}^{\infty} x(n) \cdot x(l+n+m) \cdot h(l)$$

$$= r_{xx}(m) - \sum_{l=-\infty}^{\infty} \sum_{n=-\infty}^{\infty} x(n) \cdot x(l+n+m) \cdot h(l)$$

$$= r_{xx}(m) - \sum_{l=-\infty}^{\infty} r_{xx}(l+m) \cdot h(l)$$

$$= r_{xx}(m) - h(-m) \rightarrow r_{xx}(m) - h(m)$$

$$r_{xy}(m) - r_{xx}(m) = -h(m) \rightarrow h(m)$$

which is sometimes herein referred to as "method two." From the method two, the cross-correlation result is seen as the difference between the auto-correlation of the input noise and the impulse response of the system (e.g., the cross-correlation of the folding product of the phase error and the pseudo-random noise). The PLL impulse response can be obtained from the cross-correlation results by subtracting the auto-correlation of the pseudo-random noise. In some embodiments, although not so limited, the results can be inverted. As shown by the method two, from the cross-correlation results (obtained in a manner consistent with method one), the auto-correlation of the pseudo-random noise is subtracted for obtaining the PLL impulse response. Thus, the PLL impulse response is equivalent to a phase demodulated clock signal at (pout with cross-correlation of the pseudo-random noise. The advantage of the method two is that the Dirac pulse is gone which is caused by the auto-correlation of the pseudo-random noise and which is present in the phase error signal as well, and also the noise contribution of the autocorrelation part in the cross-correlation result is removed. Reducing the noise in the signal can increase the sensitivity of the method. With the result, many PLL parameters can be analyzed, such as spectral analysis of the transfer function, evaluation of the shape etc.

In such embodiments, the correlation circuit includes at least one multiplier, at least one summing circuit and a filter circuit that derive the PLL impulse response from the cross-correlation obtained using a difference between a phase error of the PLL and the pseudo-random noise. The PLL impulse response is derived and/or assessed from the cross-correlation result, such as by subtracting the auto-correlation from the cross-correlation result (e.g., the difference between the auto-correlation of the pseudo-random noise and cross-correlation of the impulse response of the phase error and the pseudo-random noise). In some specific embodiments, the PLL impulse response is derived and/or assessed by inverting the results of subtracting the auto-correlation from the cross-correlation results, although embodiments are not so limited.

Example impulse responses of the first order PLL can include:

$$ht_1(t) = \omega_r \cdot e^{-\omega_r t} \rightarrow ht_{1e}(t) =$$

$$\delta(t) - \omega_r \cdot e^{-\omega_r t} \rightarrow ht_{1e}(0+) \rightarrow -\omega_r \frac{\partial ht_{1e}(t)}{\partial t}\bigg|_{t=0+} \rightarrow \omega_r^2.$$

Example impulse responses of second-order PLL can include:

$$ht_2(t) = e^{-\zeta \omega_n t} \frac{2\zeta \cdot \sqrt{\zeta^2 - 1} \cdot \omega_n \cdot \cosh(\sqrt{\zeta^2 - 1} \cdot \omega_n \cdot t) + (1 - 2 \cdot \zeta^2) \cdot \omega_n \cdot \sinh(\sqrt{\zeta^2 - 1} \cdot \omega_n \cdot t)}{\sqrt{\zeta^2 - 1}}$$

-continued $$ht_{2e}(t) = \delta(t) - e^{-\zeta \cdot \omega_n \cdot t} \frac{2\zeta \cdot \sqrt{\zeta^2-1} \cdot \omega_n \cdot \cosh(\sqrt{\zeta^2-1} \cdot \omega_n \cdot t) +}{\sqrt{\zeta^2-1}} \rightarrow$$

$$ht_{2e}(0+) \rightarrow 2\zeta \cdot \omega_n \frac{\partial ht_{2e}(t)}{\partial t}\bigg|_{t=0+} \rightarrow (1-4 \cdot d^2) \cdot \omega_n^2$$

with similar impulse responses for other order PLLs. The phase transfer function with noise at the input can be determined by the folding the noise input with the impulse response, such as:

$\varphi_{e,N}(t) = \varphi_N(t) * ht_e(t)$, which can done by controlling the PLL 104.

As further illustrated herein, the apparatus 100 can include various additional components. Example components include a noise generator circuit, among other components.

FIGS. 2A-2B illustrate example apparatuses, in accordance with the present disclosure. FIGS. 2A-2B can include the apparatus illustrated by FIG. 1, with additional components separately illustrated. As illustrated by FIG. 2A, the apparatus 210 includes the previously described signal control circuitry (e.g., signal delay circuit 214 and signal-delay control circuit 216), a PLL 218, and a correlation circuit 220. As previously described, the signal control circuitry can include or be signal delay circuitry that combines the reference clock signal with (e.g., comprises) pseudo-random phase noise using a control signal that carries the pseudo-random noise. However, embodiments are not so limited and other types of circuitry can be used to modulate the reference clock signal with the pseudo-random noise, as described above in connection with FIG. 1.

In various embodiments, the apparatus 210 includes a pseudo-random noise generator circuit 212. The pseudo-random noise generator circuit 212 provides a control signal carrying the pseudo-random noise. For example, the pseudo-random noise is provided to both the signal-delay control circuit 216 and the correlation circuit 220 for determining PLL parameters. An example pseudo-random noise generator circuit 212 can include a linear feedback shift register (LFSR), however embodiments are not so limited. As previously described, the pseudo-random noise is used to modulate the phase of the input signal of the PLL, such as the reference clock signal of the PLL 218.

As illustrated by FIG. 2A, the signal control circuitry can include a separate signal delay circuit 214 and signal-delay control circuit 216. The pseudo-random noise is added to the control signal or otherwise provided as the control signal to the signal-delay control circuit 216. The signal-delay control circuit 216 passes one of two output signals responsive to the control signal carrying the pseudo-random noise. For example, the two output signals include the application clock signal 211 and the delayed clock signal (e.g., the delayed, phase shifted version of the application clock signal 211). The signal delay circuit 214 provides the delayed clock signal to the signal-delay control circuit 216. The signal-delay control circuit 216 passes one of application clock signal and the delayed clock signal as the reference clock signal (e.g., input signal) to the PLL 218 based on the control signal. Thus, the reference clock signal provided to the PLL 218 switches depending on the control signal carrying the pseudo-random noise between the application clock signal 211 itself or the delayed clock signal. As such, the reference signal of the PLL is phase modulated.

As illustrated by FIG. 2B, an example apparatus 222 includes the previously described signal control circuitry (e.g., variable delay line circuit 226 that integrated both the signal delay circuit and the signal-delay control circuit), a PLL 228, and a correlation circuit 230, as well as, optionally, a pseudo-random noise generator circuit 224, as previously described. In such embodiments, the signal delay circuit is integrated with the signal-delay control circuit as part of a variable delay line circuit 226. The pseudo-random noise is used to modulate the phase of the reference clock signal (reference frequency signal or reference phase signal) via the control signal of variable delay line circuit 226. The variable delay line circuit 226 adds a variable delay to the delay between the output and the input of the delay line, and passes an output signal responsive to the control signal carrying the pseudo-random noise. The output signal includes the application clock signal 211 or a delayed clock signal. In various embodiments, variable delay line circuit 226 adds a variable delay by using a capacitor bank between two buffers or by using switchable caps between outputs and inputs of a buffer chain. Both implementations allow switching of delay, with the latter one in a more linear manner. In a specific embodiment, the control signal, for example, is used by the variable delay line circuit 226 to select a delay path to derive the output signal. The signal-delay control circuit 216 passes one of the plurality of output signals based on the control signal to the PLL 228. Thus, the reference clock signal provided to the PLL 228 switches depending on the control signal carrying the pseudo-random noise between the application clock signal 223 itself or one of the plurality of delayed clock signals.

In either of the embodiments illustrated by FIGS. 2A and 2B, the self-testing of the PLL can be conducted after production testing, such as when the apparatus is in the field. The self-testing of the PLL can occur concurrently with processing of the application signal, at each power-up of the apparatus, periodically, and/or continuously. In some embodiments, such as when the application signal is processed concurrently with the self-testing, at least a portion of the pseudo-random phase noise can be removed from the output signal of the PLL as provided as an output from the apparatus using a previously generated pseudo-random phase noise. The amount of the previously generated pseudo-random phase noise can be determined and used to remove the at least portion of the pseudo-random phase noise at the output of the PLL system. Alternatively, in various embodiments, the noise level added to the input to the PLL can be low enough to not impact performance of the PLL. In some specific embodiments, the added noise can be kept effectively more than 10 dB below the performance of the system. In such embodiments, the resolution of system can be high enough that the added pseudo-random phase noise is processed without significant clipping effects. By the means of cross-correlation, the performance of the PLL can be extracted while the pseudo-random phase noise is not dominant. Such embodiments can avoid the need for additional noise mitigation circuitry that compensates for the added noise.

In a number of embodiments, the cross-correlation, such as via the apparatuses illustrated by FIGS. 1-2B can be used to detect whether or not the PLL is locked. For example, using the output signal from the phase detector and the input signal (e.g., the reference clock signal), it can be determined whether the PLL is locked or not, and the self-test of the PLL can be in response to the determining that the PLL is locked, although embodiments are not so limited. For example, only in a locked PLL does the PLL output signal correlate to the input signal. As such, the phase transfer function and impulse response are gained by the above-described methodologies, in such implementations, only if the PLL is locked. This can be important as conventional lock detectors are sometimes unreliable as they often use as lock criterion that the phase difference measured by the phase comparator stays below a certain limit for a certain time interval. This criterion is error prone, however, due to phase noise of the PLL itself and/or the input signal to the PLL, this phase difference fluctuates. The fluctuation implies that a certain headroom needs to be added to the phase difference limit of the lock detector. Choosing this headroom too high makes the lock detector too insensitive to out-of-lock situations, while choosing the headroom too low makes the lock detector too sensitive to phase noise. Deriving the locked/unlocked information from the time-averaged cross-correlation signal r overcomes this.

In other embodiments and/or in addition, the pseudo-random noise is used for dithering purposes. In some systems that use a PLL, the PLL output frequency is intentionally continuously randomly modulated over a small frequency range (e.g., it is "dithered"). That way, the PLL output signal is not concentrated in a single frequency, but over a certain frequency band. Hence, also the unintended electromagnetic emission of the system is distributed over a certain frequency band. This reduces both the disturbance from the system to its environment, and the sensitivity of the system to disturbances from the environment. In such embodiments, the pseudo-random noise has a frequency spectrum and an amplitude that (is intended to) dithers the input clock (e.g., the input application clock signal) in order to mitigate or avoid idle tones and/or in order to spread the PLL output clock spectrum over a wider range for reducing Electromagnetic Interference. The noise can, for example, be derived from a resistor, divider, or other system component, by means of an amplifier, and which allows for real noise to be used.

This dithering can be done by modifying the PLL output frequency using a control signal that modifies the frequency divider ratio of a clock divider in the PLL. This control signal can be either a deterministic signal or a pseudo-random signal. In case a noise signal is used, this noise signal can also be used for the correlation methodologies described above. In some cases, however, the spectrum of this noise signal used for dithering does not correspond to the spectrum of pseudo-random white noise (or pseudo-random noise with flat spectrum), e.g., because the lower frequencies are missing. In these cases, it may be advantageous to add the lower frequency components to the dithering noise signal. Using this (possibly modified) dithering pseudo-random noise signal obviates using a dedicated noise source for the cross-correlation method; moreover, it does not add additional phase noise that might impair the application.

Additionally in a number of embodiments, the PLL can include an all-digital PLL (ADPLL) having a digital loop filter and phase detector that provides a digital signal output. The general advantage of an ADPLL is that signal processing is mostly done in the digital domain. Most of the components if not all are digital. Usually the oscillator and some other components are analog. The loop filter is built up by small digital circuitry instead of an analog circuitry that may take much area, mostly due to the need of large capacitors. Moreover, as an ADPLL has a digital loop filter that can be easily re-configured, it is robust against aging, process spread and variations of temperature and supply voltage. The special advantage of an ADPLL, when used in connection with the above-described techniques, is that the noise injection can be performed using a digitally controlled delay line. In this case, the pseudo-random noise signal controls the digital delay line. As controllable delay lines can be part of an ADPLL and for use of noise injection simply another instance of the controllable delay line is added. Another advantage of an ADPLL, when used with the above-described techniques, is that the phase difference as measured by the phase detector is already available as a digital signal, such that it can be directly processed by a digital system. Furthermore, if the reference phase word is already digital, the delay line may not be required and the pseudo-random phase noise is added directly to the reference phase word.

In number of embodiments of the present disclosure, the calculated phase transfer function of the PLL is used for trimming important (e.g., specification tight) components of the PLL, such as components that are sensitive to process spread, voltage variations, temperature, aging, etc. Depending on the details of the PLL, this can be the oscillator and/or, for analog PLLs, and/or other components of the loop filter. In some implementations, the possibility of trimming in real-time allows using simpler, smaller or cheaper components for the oscillator and/or the loop filter.

Figure 3:
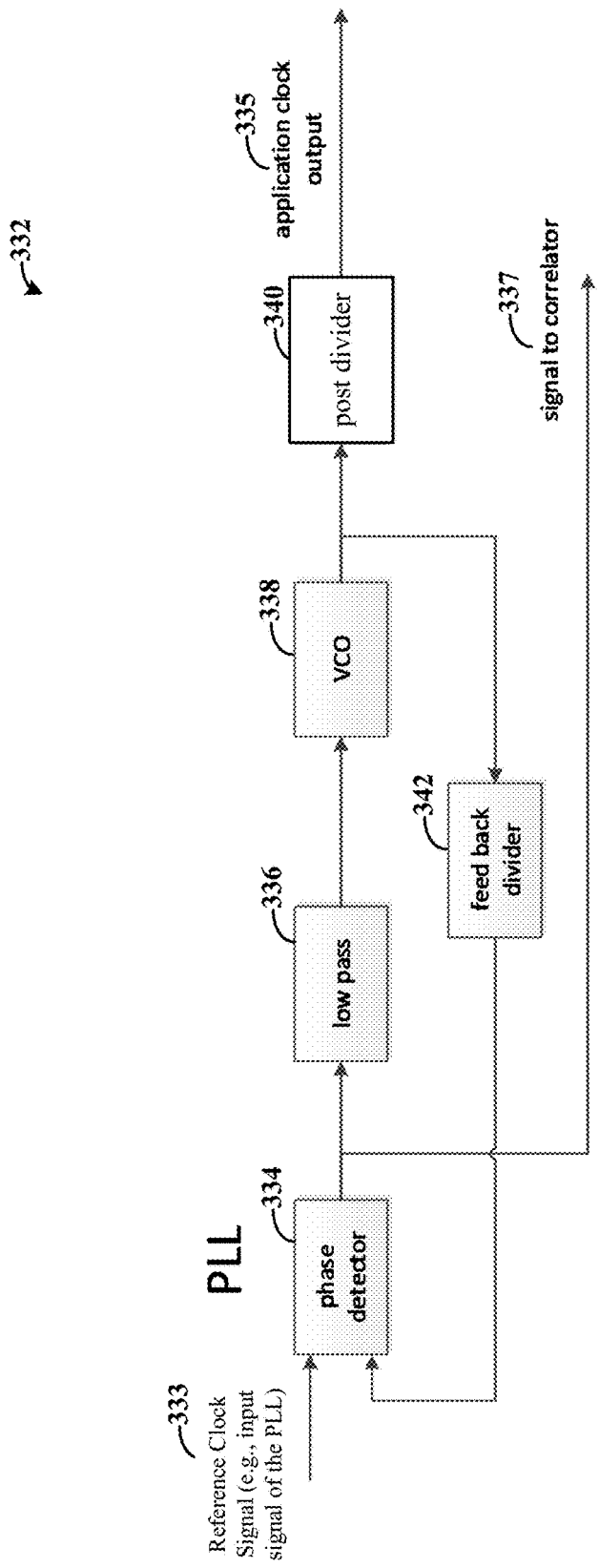
FIG. 3 illustrates an example PLL, in accordance with the present disclosure.

FIG. 3 illustrates an example PLL, in accordance with the present disclosure. As illustrated a reference clock signal 333 is input to the PLL 332. The reference clock signal 333 can be switched between the at least two output signals depending on the control signal. In the specific embodiments illustrated by FIG. 3, the control signal is carrying the pseudo-random noise, as previously described. The PLL 332 includes a phase detector 334, a low pass filter 336, a VCO 338, a post divider circuit 340 and feedback divider circuit 342. Although embodiments are not limited to the specific circuit components illustrated by FIG. 3 and can include various variations, such as different oscillators and an ADPLL, among other variations. As previously described, the phase detector 334 provides a phase error signal based on a phase difference between its inputs, namely, the reference clock signal 333 and a feedback signal provided by the feedback divider circuit 342. The output of the phase detector 334 is provided as an input signal to the correlation circuit 337 and used to provide the cross-correlations, as previously described.

As illustrated, the apparatus can self-test the PLL 332 while processing the application clock signal. For example, the low pass filter 336 filters the phase error signal output by the phase detector 334 (e.g., the phase error signal being proportional to a phase difference of the one of the at least two output signals from the signal-delay control circuit and a feedback signal from the PLL). The VCO 338 provides an output responsive to the filtered phase error signal. A feedback loop, which includes a feedback divider circuit 342, divides the output of the VCO, and provides the feedback signal to the phase detector 334 responsive to the output of the VCO. For example, the VCO outputs an application clock signal output having a phase, which is fed through the optional feedback divider circuit 342 and a divided version is fed as a feedback signal to the phase detector 334 as negative feedback. Additionally, the output of the VCO is provided to the post divider circuit 340 which divides the output of the VCO and provides the same as the application clock output signal 335.

Figure 4:
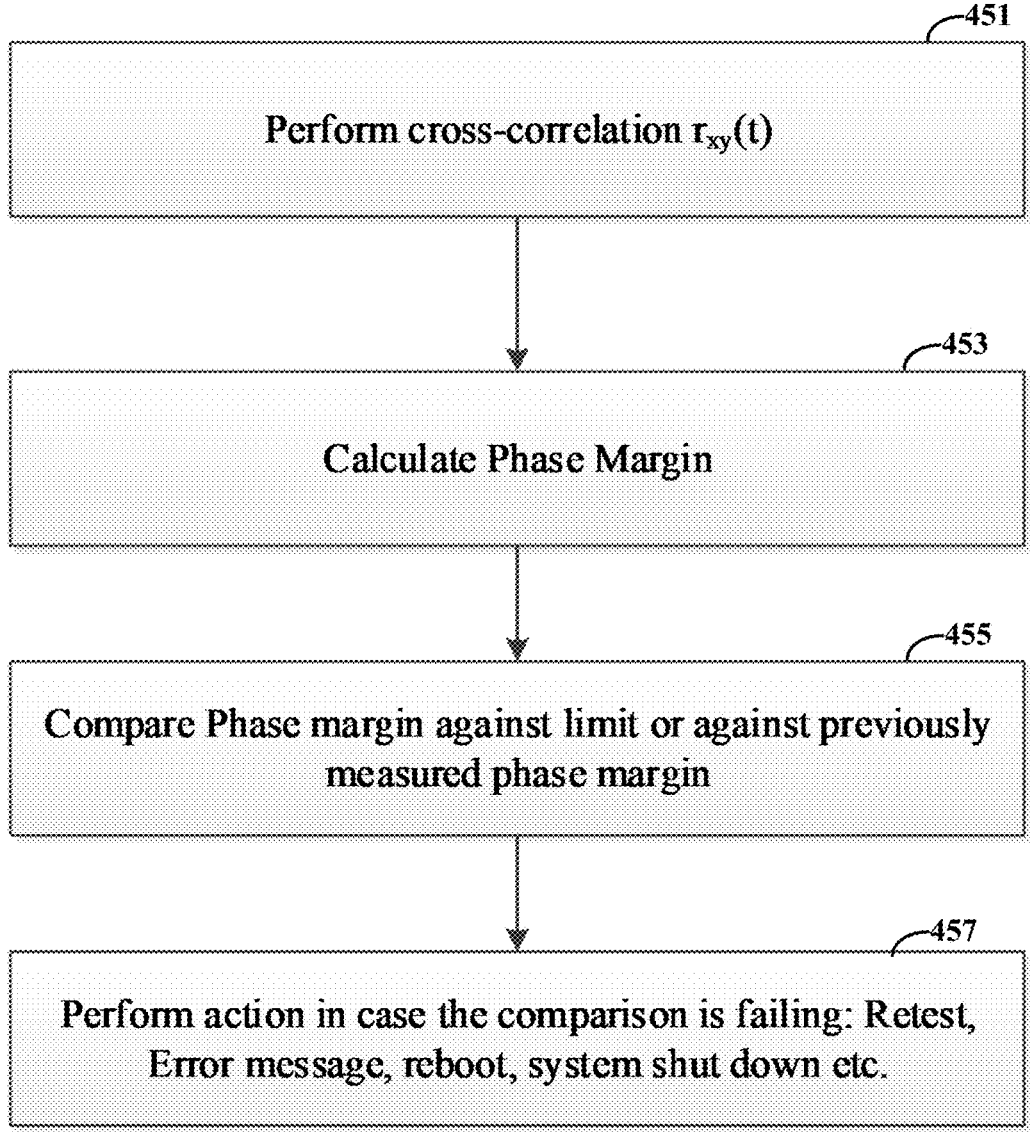
FIG. 4 illustrates an example of a process for self-testing a PLL of an apparatus, in accordance with the present disclosure.

FIG. 4 illustrates an example of a process for self-testing a PLL of an apparatus, in accordance with the present disclosure. The self-test of the PLL can include the cross-correlation used to derive the PLL impulse response, at 451.

Figure 6:
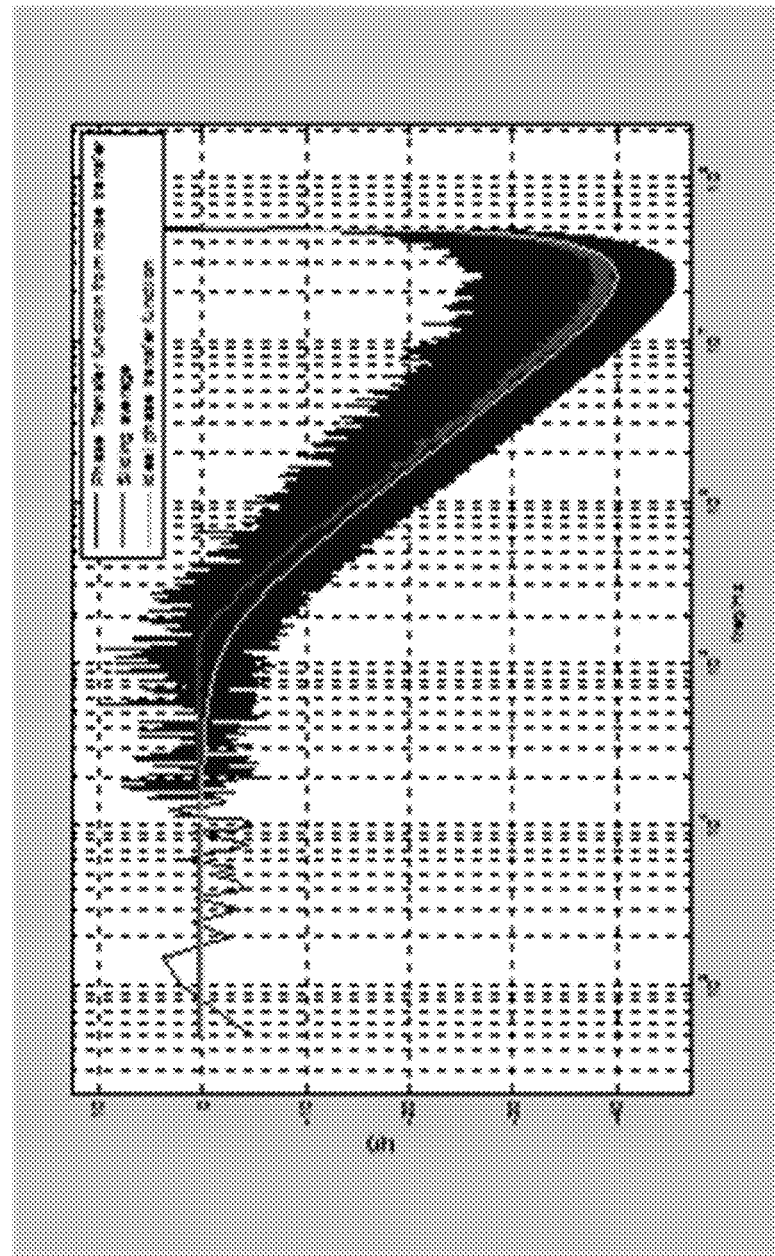
FIG. 6 illustrates a graph showing an estimation of the phase transfer function using the noise correlation, in accordance with the present disclosure.

From the cross-correlation, a phase margin can be calculated (e.g., using the PLL impulse response), at 453, which can be compared to a known threshold indicative of at least one of a phase margin limit and a previously calculated phase margin limit, at 455. Although FIG. 4 illustrates the phase margin being calculated, other specific parameters such as natural frequency, damping, 3 dB bandwidth, etc., can be derived the same manner. The phase margin limit can include a specific value and/or an upper limit and lower limit (e.g., min/max). In some embodiments, the phase margin limit can include a minimum and maximum limit. In various specific embodiments, there may be a lot of noise in the clock input signal, VCO, etc. If so, the phase margin limits can be defined as upper limit (e.g., the peak) and to the slope of the impulse response or directly to the two points as indicated by FIG. 6 in order to improve significance of the self-test of the PLL.

In a number of embodiments, one or more actions can occur in response to the comparison, at 457. For example, the self-testing of the PLL can indicate a circuit failure. In response to the indication of circuit failure, the apparatus can perform an action based on the failure, such as rerunning the self-test, providing an error message, rebooting the apparatus, powering the apparatus down, and various combinations thereof. As a specific example, using the cross-correlation (e.g., the PLL impulse response derived therefrom), a phase margin can be determined and used to determine a phase transfer function. The apparatus can trim at least one component of the PLL responsive to the determined phase transfer function.

Figure 5:
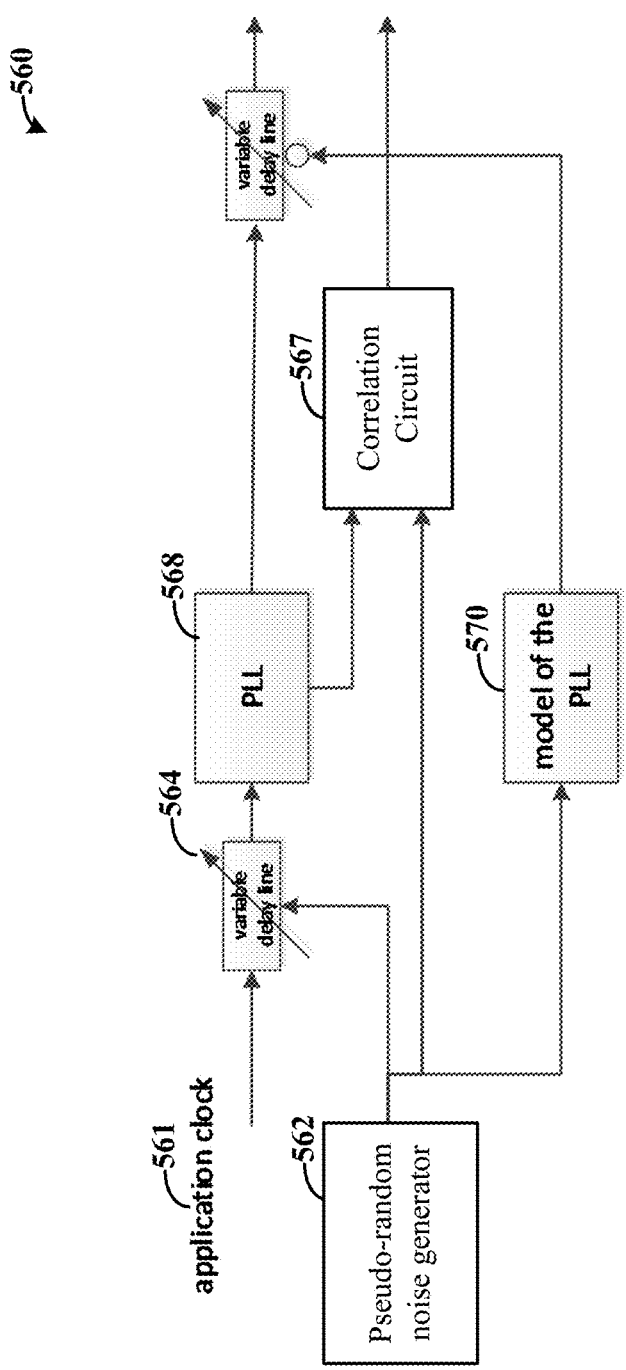
FIG. 5 illustrates an example apparatus, in accordance with the present disclosure.

FIG. 5 illustrates an example apparatus, in accordance with the present disclosure. The apparatus 560 can include the apparatus previously illustrated and described by FIGS. 1 and 2A-2B, although embodiments are not so limited. More specifically, the apparatus 560 can include circuit components previously described in connection with the apparatus illustrated by FIG. 2B and including the pseudo-random noise generator circuit 562, the variable delay line 564 that provides the reference clock signal carrying or comprising the pseudo-random phase noise (responsive to application clock signal 561 and the control signal carrying the pseudo-random noise), the PLL 568, and the correlation circuit 567. Additionally, the apparatus 560 includes noise mitigation circuitry such as circuitry 570 used to model the PLL and other circuitry (e.g., another variable delay line) and which is used to remove at least a portion of the pseudo-random phase noise from the output of the PLL.

In various embodiments, at least a portion of the pseudo-random phase noise can be removed from an output provided by the PLL. For example, using a cross-correlation of a previous signal corresponding to another output signal from the phase detector with another control signal carrying pseudo-random noise, a model of the pseudo-random phase noise can be determined and used to remove the portion of the pseudo-random phase noise. As described above, embodiments are not limited to use of noise mitigation circuitry and the noise level added to the reference clock signal of the PLL can be low enough so that it does not impact to the performance of the PLL system.

For example, the added pseudo-random phase noise can be subtracted from the output signal of the PLL after passing a software-implemented model of the PLL. The transfer characteristic of this model, e.g., the transfer characteristic of the PLL, is known from a previous parameter estimation using the pseudo-random noise. By this means, the additional noise level at the PLL output can be substantially reduced, albeit at the expense of additional computation effort. As illustrated by FIG. 5, the apparatus can include modelled circuitry 570 used to model the PLL. The modelled circuitry 570 can be used to determine the previous pseudo-random noise estimation and model the current pseudo-random phase noise using the previous pseudo-random phase noise estimation. The circuitry 570 is a software-implemented model that is processed by processing circuitry. The pseudo-random phase noise (or at least a portion thereof) can be subtracted from the application clock output provided by the oscillator of the PLL and as provided as an output by the integrated circuit.

Figure 7:
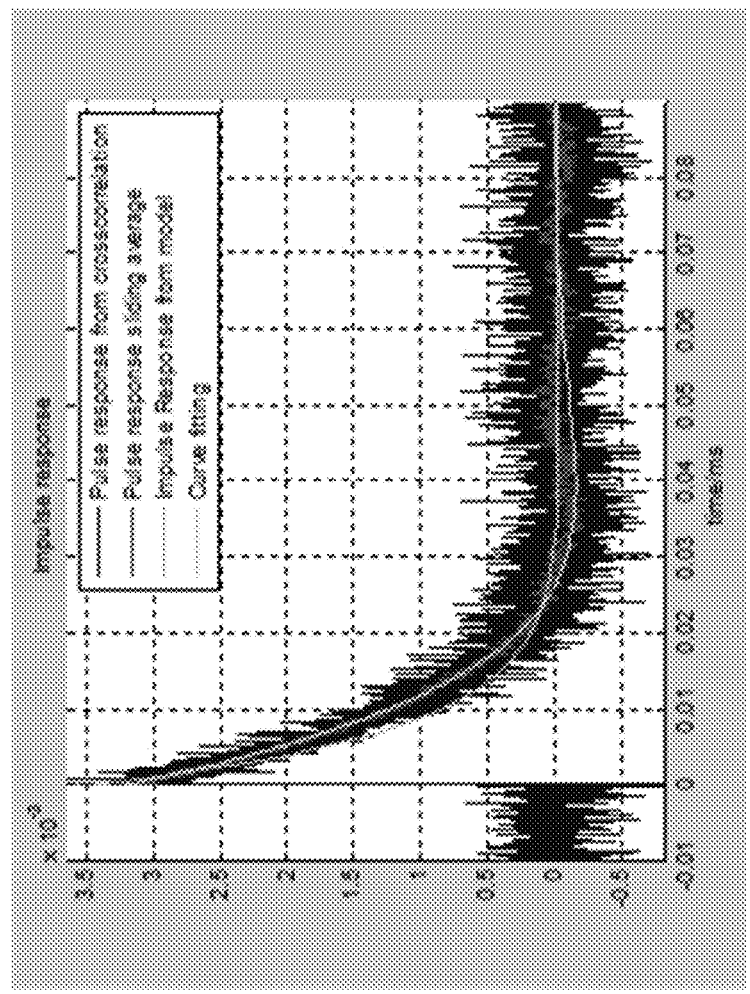
FIG. 7 illustrates a graph showing a simulated PLL impulse response after subtracting the auto-correlation of the pseudo-random noise, a sliding average, and an impulse response calculated from the PLL closed-loop parameters, in accordance with the present disclosure.
Figure 8:
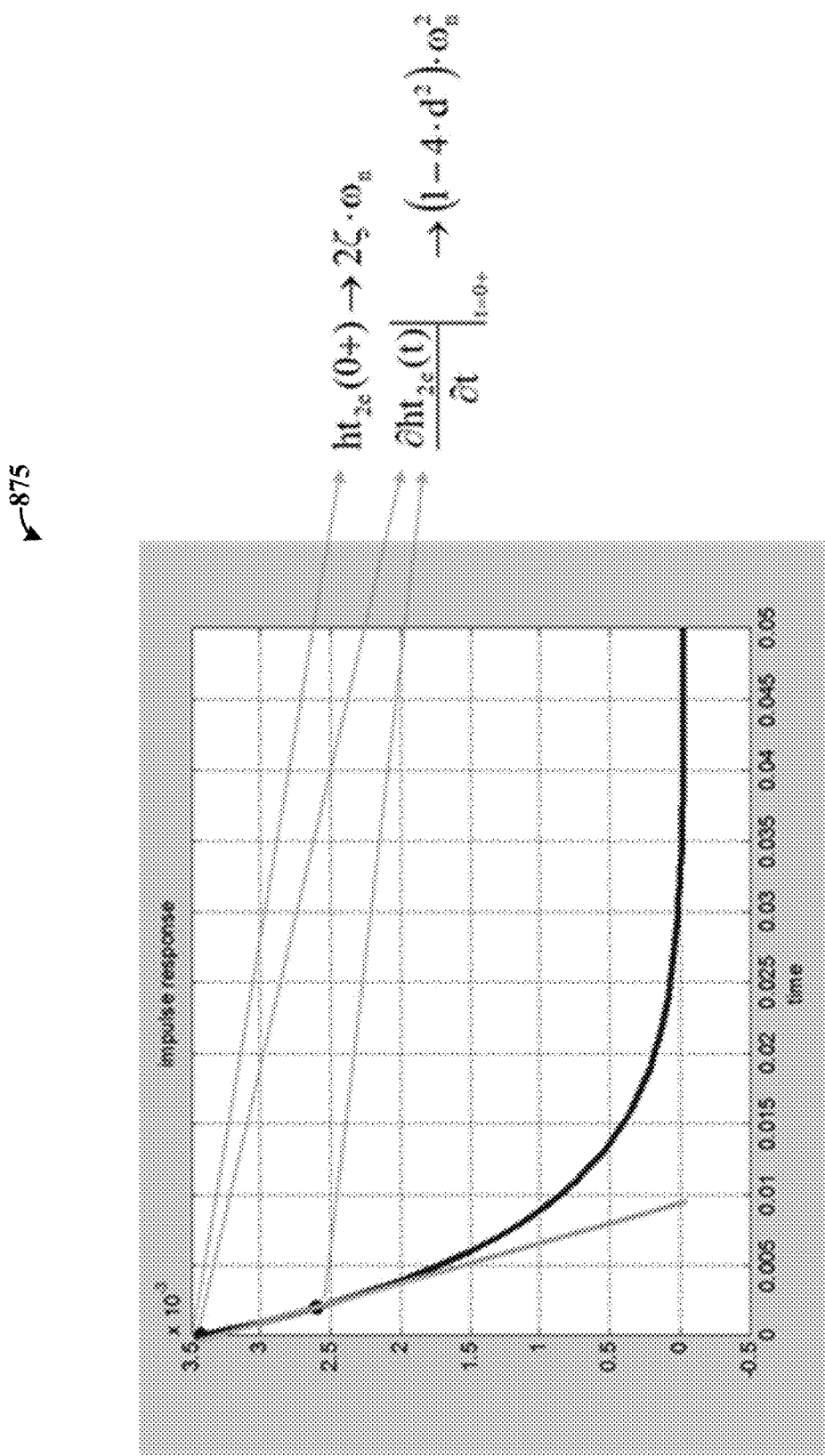
FIG. 8 illustrates a graph showing derived PLL parameters, in accordance with the present disclosure.

FIG. 6-8 illustrate example experimental embodiment results in accordance with the present disclosure. To demonstrate the above-described technique, the response of an ADPLL to superimposed pseudo-random white noise is simulated. The amplitude of the superimposed pseudo-random noise is chosen such that the total noise of the PLL stays within the specification limit, e.g., such that this noise does not disturb the application.

The cross-correlation $r_{xy}(m)$ is calculated using MATLAB and applying the second of the above methodologies (sometimes referred to as method two). The resulting phase transfer function of the ADPLL is calculated using an FFT. To reduce the noise on the transfer function, a sliding average can be calculated.

More specifically, FIG. 6 illustrates a graph 671 showing an estimation of the phase transfer function using the noise correlation, and also the ideal transfer function is calculated from the ADPLL parameters. The graph 671 illustrates that the noise correlation method (e.g., method two) is able to estimate the phase transfer function with precision. FIG. 7 illustrates a graph 773 showing a simulated PLL impulse response after subtracting the auto-correlation of the pseudo-random noise, a sliding average, and an impulse response calculated from the PLL closed-loop parameters, in accordance with the present disclosure. As illustrated, the curve fits with the model. FIG. 8 illustrates a graph 875 showing derived PLL parameters, in accordance with the present disclosure.

To estimate the benefit of subtracting the auto-correlation component of the pseudo-random noise signal, as described above, this method is applied to a simulated cross-correlation (and thus impulse response) signal. To assess how well the calculated impulse response matches the impulse response as calculated from the ADPLL parameters, also the calculated impulse response is drawn, which is shown by the graph 773. These results show that subtracting the auto-correlation component from the impulse response significantly reduces the added noise to the calculated transfer function.

In many embodiments, it is not necessary to calculate the impulse response in a large range. Often it may be sufficient to derive the loop parameters from a limited number of points of the impulse response and to characterize the impulse response this way.

FIG. 8 more specifically shows an example of deriving damping and natural frequency of the system from two parameters of the impulse response: starting value h(0) and the slope at the beginning of the impulse response:

$$\left. \frac{\partial ht_{2e}(t)}{\partial t} \right|_{t=0}.$$

Although, as described above, both the system response and the impulse response of the phase error can be used for this operation due to the similarity between the two.

Figure 9:
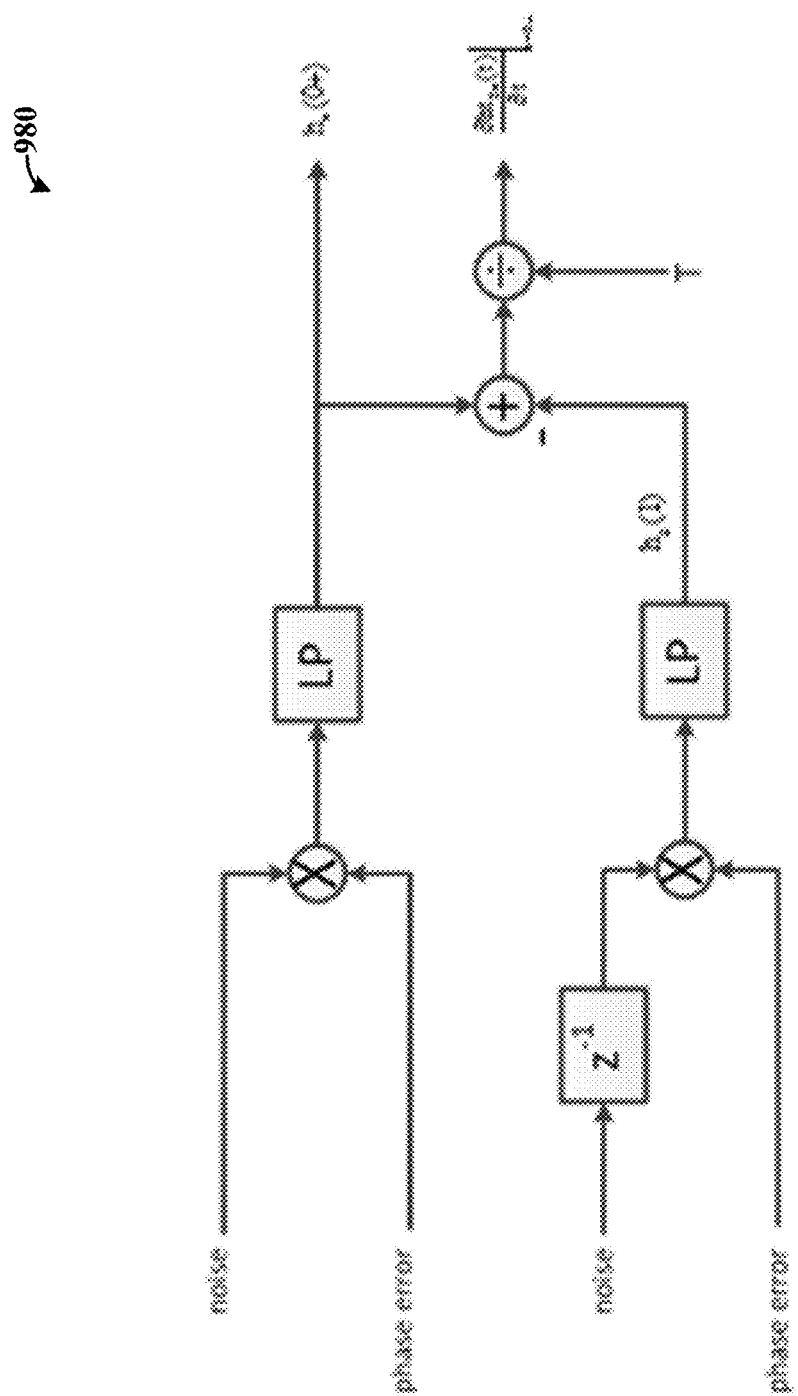
FIG. 9 illustrates an example correlation circuit that processes the phase error as the PLL impulse response, in accordance with the present disclosure.
Figure 10A:
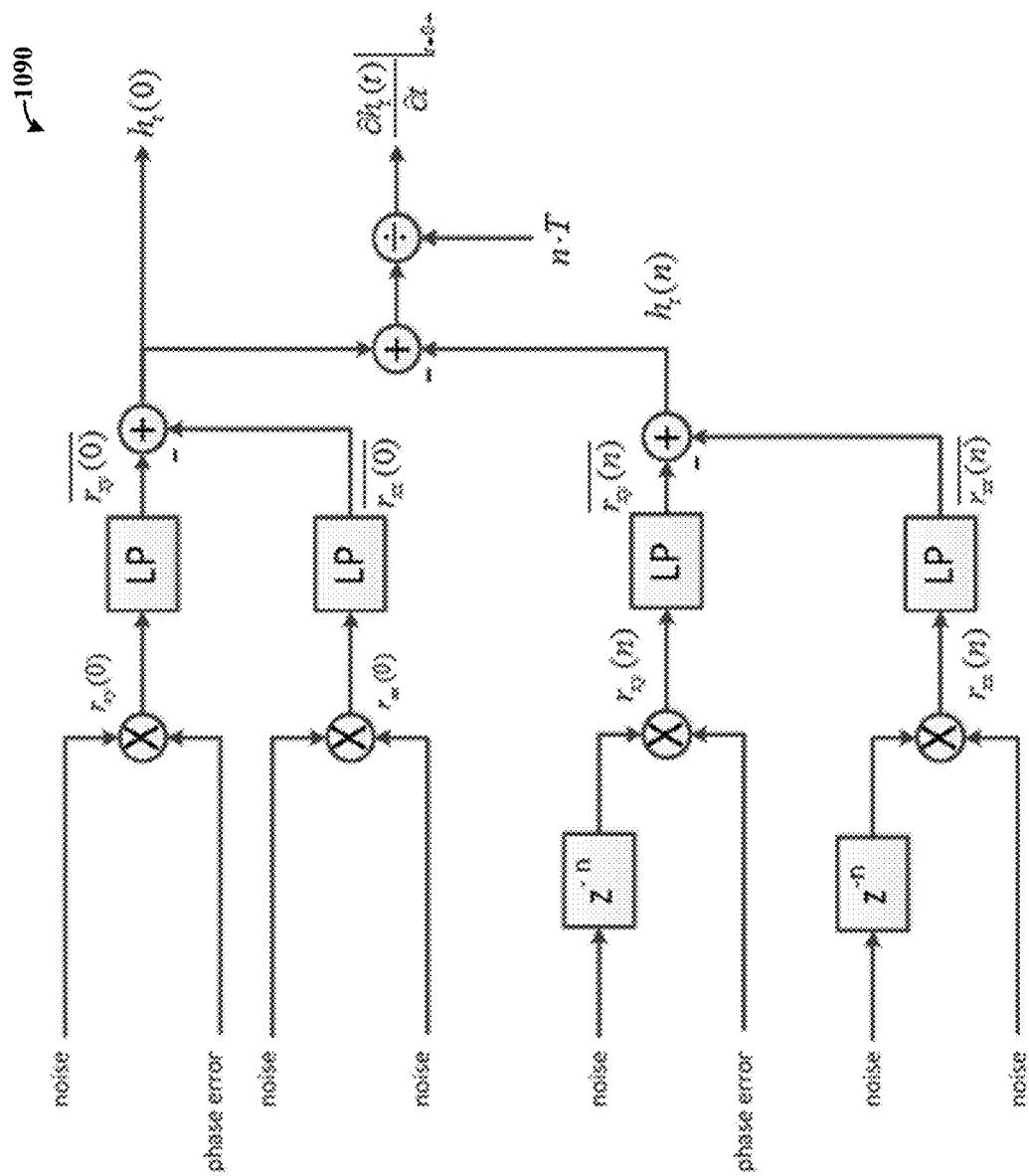
FIGS. 10A-10B illustrate example correlation circuits that used the phase error to derive the PLL impulse response, in accordance with the present disclosure.
Figure 10B:
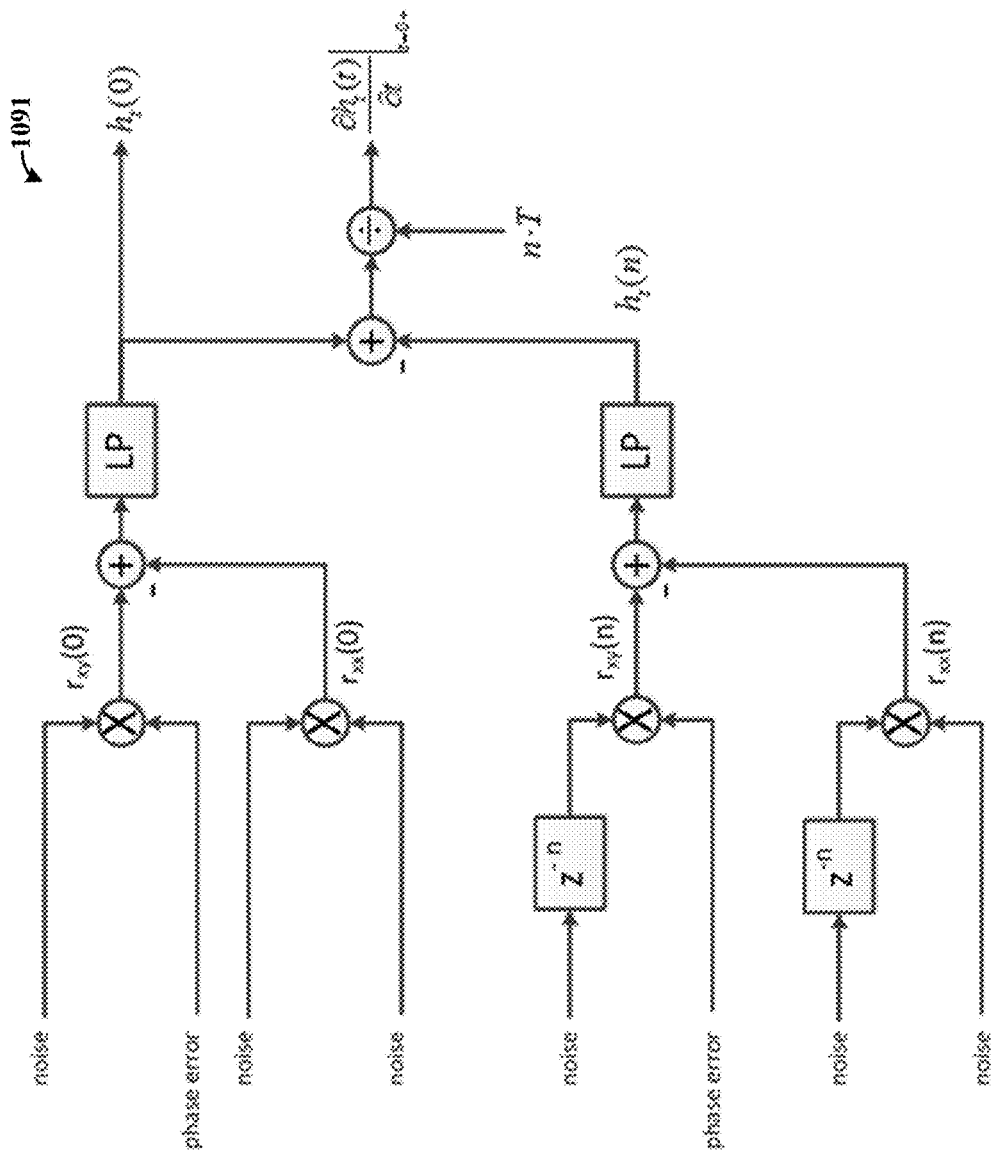

As further described below, FIGS. 9 and 10A-10B show examples of how the PLL parameters may be derived from the phase error and noise data streams. In case only the product of damping and natural frequency is analyzed, then only the upper respective part of the example is used. The examples repeat paths for understanding the delay path for the noise data stream. In various implementations this can be shared. Furthermore, it is possible to share multipliers and to do multiplication sequentially for the different components and to update the low pass filters when a new result is available. However, in modern technologies, digital circuitry is small and the implementation of the correlation with a digital circuit can consume less area and power.

In both methods, as further illustrated by FIGS. 9 and 10A-10B, the noise and phase error are multiplied at a certain phase relation which is a delay between the two phases. Some possible latency from the circuitry is assumed to be compensated. The low pass filter is for averaging the result. For the slope calculation, the result for timing point m=0 and m=1 are subtracted and divided by the clock period. Any other timing points may be used as well for slope calculation. Also, the distance may be larger, e.g., to increase accuracy and to reduce impact by some residual noise. In the embodiments illustrated herein, the difference is divided by the proper multiple of the clock period to derive the slope. Method two is an extension of method one by subtracting the corresponding auto-correlation component of the noise from the cross-correlation result. As shown above the noise content can be reduced by method two. Hence, the low pass filter may have a larger bandwidth and detection speed can be higher.

With an adjustable delay it is possible to characterize the impulse response and the system characteristic over a larger range with low effort if it is acceptable that the characterization takes some time, that the points of the impulse response for different delays are not available simultaneously and may not be consistent if the system characteristic changes over time.

FIG. 9 illustrates an example correlation circuit that processes the phase error as the impulse response of the PLL, in accordance with the present disclosure. As previously described (e.g., method one), the phase error can be processed directly as the system response of the PLL, such as for PLLs having high pass characteristics. The correlation circuit 980 as illustrated by FIG. 9 includes at least one summing circuit (e.g., +) and at least one filter circuit (e.g., low pass filters (LP)) used to derive the PLL impulse response directly from the cross-correlation between the phase error of the PLL and the pseudo-random noise. More specifically, the impulse response is derived from a folding product of the phase error and the pseudo-random noise.

For example, the output signal of the PLL can be calculated by folding the noise with the impulse response of the phase error, such as by:

$$y(m) = \sum_{n=-\infty}^{\infty} x(n) \cdot h(n-m).$$

The cross-correlation between the input and output signals provides the impulse response again, and from the impulse response, PLL parameters can be derived. As an example: $r_{xy}(m)$ $$r_{xy}(m) = \sum_{n=-\infty}^{\infty} x(n) \cdot y(n+m)$$

$$= \sum_{n=-\infty}^{\infty} x(n) \cdot \sum_{l=-\infty}^{\infty} x(l) \cdot h(l-n-m)$$

$$= \sum_{l=-\infty}^{\infty} \sum_{n=-\infty}^{\infty} x(n) \cdot x(l) \cdot h(l-n-m)$$

$$= \sum_{l=-\infty}^{\infty} \sum_{n=-\infty}^{\infty} x(n) \cdot x(l+n+m) \cdot h(l)$$

$$= \sum_{l=-\infty}^{\infty} r_{xx}(l+m) \cdot h(l)$$

$$= \sum_{n=-\infty}^{\infty} r_{xx}(m-n) \cdot h(-n)$$

$$= h(-m) \to h(m)$$

For a first order PLL, example calculations in an experimental embodiment can include noise of x(t) which includes pseudo-random noise with certain amplitude (e.g., +/−0.1 of a period length or less). The first order impulse response of the phase error with $\omega_r$=100 kHz (e.g., as an example, although embodiments are not limited to 100 kHz) can include:

$$h_{1_e}(t) = \delta(t) - \omega_r \cdot e^{-\omega_r t},$$

and folding the pseudo-random noise with the impulse response of the phase error can be defined by:

$$y(t) = x(t) * h_{1_e}(t).$$

The above describes an example calculation for a first order PLL. However embodiments are not limited to first order PLLs and can include $2^{nd}$ order (or higher) PLLs. With a first order PLL, the impulse responses can include:

$$ht_1(t) = \omega_r \cdot e^{-r \cdot t} \to h_{1_e}(s) = \delta(t) - \omega_r \cdot e^{-\omega_r t},$$

and a second order PLL impulse responses can include:

$$ht_2(t) = e^{-\zeta \omega_n t} \frac{2\zeta \cdot \sqrt{\zeta^2 - 1} \cdot \omega_n \cdot \cosh(\sqrt{\zeta^2 - 1} \cdot \omega_n \cdot t) + (1 - 2 \cdot \zeta^2) \cdot \omega_n \cdot \sinh(\sqrt{\zeta^2 - 1} \cdot \omega_n \cdot t)}{\sqrt{\zeta^2 - 1}}$$

$$ht_{2e}(t) = \delta(t) - e^{-\zeta \omega_n t} \frac{2\zeta \cdot \sqrt{\zeta^2 - 1} \cdot \omega_n \cdot \cosh(\sqrt{\zeta^2 - 1} \cdot \omega_n \cdot t) + (1 - 2 \cdot \zeta^2) \cdot \omega_n \cdot \sinh(\sqrt{\zeta^2 - 1} \cdot \omega_n \cdot t)}{\sqrt{\zeta^2 - 1}}$$

FIGS. 10A-10B illustrate example correlation circuits that use the phase error to derive the PLL impulse response, in accordance with the present disclosure. That is, FIG. 9 illustrates an example circuit implementation of method one and FIGS. 10A-10B illustrate example circuit implementations of method two. Method two is an extension of method one, for example, in which from the cross-correlation results, the auto-correlation of the pseudo-random noise is subtracted. As illustrated by FIGS. 10A and 10B, the correlation circuits 1090, 1091 include at least one summing circuit and at least one filter circuit used to derive the PLL impulse response from the cross-correlation of the phase error, e.g., the differentiate between the input phase and output phase, and the pseudo-random noise. The cross-correlation, for example, provides the impulse response of the phase error, and therefrom, the PLL impulse response is derived from a difference of results of the cross-correlation, e.g., the impulse response of the phase error, and an auto-correlation of the pseudo-random noise. In some specific embodiments, the PLL impulse response can be derived, for example, by inverting the results of the difference of the results of the cross-correlation (e.g., the impulse response of the phase error) and subtracting the auto-correlation of the pseudo-random noise (e.g., method two).

Accordingly, the impulse response of the phase error can be used to derive the PLL impulse response. Said differently, the correlation circuits illustrated by FIGS. 10A-10B can implement the process illustrated by the correlation circuit of FIG. 9 and then subtract the auto-correlation component of the noise from the cross-correlation result. In this manner, the PLL impulse response (e.g., of the output of the PLL) is equivalent to a phase demodulated clock signal at $\varphi_{out}$ with cross-correlation of the pseudo-random noise. FIG. 10A illustrates a generalized version of the correlation circuit and FIG. 10B illustrates a case in which the lowpass filters are shifted behind the summing point. The bar over a term indicates averaging by the low pass filter. The low pass filter for averaging may be shifted without changing the result but saving two low pass filters, as illustrated by FIG. 10B.

For example, the output signal of the PLL can be calculated by folding the noise with the impulse response of the phase error, such as by:

$$y_e(m) = \sum_{n=-\infty}^{\infty} x(n) \cdot h_e \cdot (n-m)$$

$$= \sum_{n=-\infty}^{\infty} x(n) \cdot (l - h(n-m)).$$

The cross-correlation between the input and output signals provides the impulse response again, and from the impulse response, PLL parameters can be derived. As previously provided, an example includes:

$$r_{xy}(m)$$

$$r_{xy}(m) = \sum_{n=-\infty}^{\infty} x(n) \cdot y_e(n+m)$$

$$= \sum_{n=-\infty}^{\infty} x(n) \cdot (x(n+m) - y(n+m))$$

$$= \sum_{n=-\infty}^{\infty} x(n) \cdot \left(x(n+m) - \sum_{l=-\infty}^{\infty} x(l) \cdot h(l-n-m)\right)$$

$$= \sum_{n=-\infty}^{\infty} x(n) \cdot x(n+m) - \sum_{l=-\infty}^{\infty} x(n) \cdot \sum_{n=-\infty}^{\infty} x(l) \cdot h(l-n-m)$$

$$= r_{xx}(m) - \sum_{l=-\infty}^{\infty} \sum_{n=-\infty}^{\infty} x(n) \cdot x(l) \cdot h(l-n-m)$$

$$= r_{xx}(m) - \sum_{l=-\infty}^{\infty} \sum_{n=-\infty}^{\infty} x(n) \cdot x(l+n+m) \cdot h(l)$$

$$= r_{xx}(m) - \sum_{l=-\infty}^{\infty} r_{xx}(l+m) \cdot h(l)$$

$r_{xx}(m) - h(-m) \rightarrow r_{xx}(m) - h(m)$ with $r_{xx}(m) = r_{xx}(-m)$, where $r_{xx}(m)$ is the auto-correlation which can be calculated by:

$$r_{xx}[l] = \sum_{m=-\infty}^{\infty} x[m]x[x-l].$$

With zero(0) lag, the above can return a maximum value and the energy of the signal from:

$$r_{xx}[0] = \sum_{n=-\infty}^{\infty} x[m]x[m] = x^2[n] = E_x.$$

Thus, the auto-correlation can include:

$R_{xx}(1) = R_{xx}(-1)$.

The above illustrates that subtracting the auto-correlation of the pseudo-random noise from the cross-correlation of the phase error with the pseudo-random noise, results in the PLL impulse response. Advantageously this can reduce the noise content of the results. Additionally, the PLL impulse response can be compared with an ideal model to provide an acceptable coincidence. And, the phase transfer function can be derived as a spectrum from PLL pulse response by FFT. The noise floor can be 5-10 dB lower (e.g., 5-10 dB more sensitivity) than if the spectrum of the phase error impulse response is evaluated.

Figure 11:
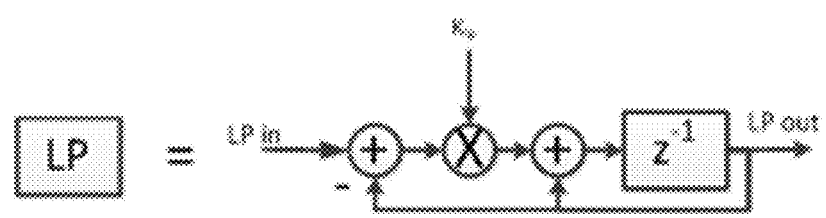
FIG. 11 illustrates an example of a low pass filter, in accordance with various embodiments.

FIG. 11 illustrates an example of a low pass filter, in accordance with various embodiments. However, embodiments are not so limited.

As previously described, various safety standards can mandate measuring performance parameters in the field. As a specific example, automotive safety standards can require a certain Failure In Time (FIT) level to keep. FIT refers to the number of safety-sensitive failures per $10^9$ operating hours that may not exceed a certain limited. Integrated circuits manufacturers may need to provide evidence that circuitry keeps a FIT level, which can be based on process reliability data showing how many defects may occur over lifetime, and data of the functional safety concept showing how many of these defects are safety-sensitive, and how many of the safety-related defects can be mitigated by functional safety measures. The limit for safety-related defects can be very tight. As examples, it can be 100 FIT for ASIL B and 10 FIT for ASIL D. These rates refer to a complete system, however—each integrated circuit is allowed to have only a fraction of this failure rate. In a typical car radar integrated circuit (IC) or IC chip (qualified for ASIL B; only the silicon considered, not the package), the allowed failure rate can be as little as 2 FIT.

Moreover, as noted above, integrated circuits sometimes fail during operation in the field—either due to aging mechanisms like negative-bias temperature instability (NBTI), hot carrier injection (HCI), and time dependent dielectric breakdown (TDDB), but also due to latent defects that are activated during lifetime. Incidents like voltage spikes in a thunderstorm or customer mishandling (e.g., electrostatic discharge (ESD) overstress during mounting, maintenance or repair) are relevant causes of integrated circuit failures in the field. Often, a partial, i.e., parametric, failure can be more severe than a complete failure. For example, a complete failure can be immediately recognized and counter-acted, while a parametric failure might not be immediately recognized. Embodiments in accordance with the present disclosure can allow for testing the parameters of the PLL by a BIST, which can allow for complying with the requirements of standards and identifying failures over the life time of the circuitry.

More specifically apparatuses in accordance with the present disclosure can be used for production testing, validation as well as for repeated self-test in the field, e.g., for functional checks. Also here, the details depend largely on the existing on-chip infrastructure and the requirements. For example, in all three modes (e.g., concurrent, intermittent at power-up, intermittent periodically) a test against fixed limits can be done for the calculated figure-of-merit. In various embodiments, not fixed test limits could be used, but the PLL parameters can be compared against PLL parameters of an identical PLL in the same integrated. Also, the apparatus can be used to store the determined PLL parameter(s) and comparing it against PLL parameter(s) determined after accelerated aging tests (e.g., in the course of validation) or after a certain operating time (e.g., during life time in the field) this test can performed to detect slow changes of parameters.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the specification (including claims) connote a plain meaning in the art unless otherwise indicated. As examples, the specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 102 and 104 of FIG. 1 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIG. 4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described at FIG. 4 and FIG. 1 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the figures may involve steps carried out in various orders, with one or more aspects of the embodiments herein retained, or may involve fewer or more steps. For instance, the circuitry illustrated by FIGS. 3, 9, 10A, 10B, and 11 can be part of the circuitry illustrated by FIG. 1. As another example, the method illustrated by FIG. 4 can be formed by the circuit illustrated by FIG. 1. Such modifications do not depart from the true spirit and scope of various aspects of the disclosure, including aspects set forth in the claims.

What is claimed is:

1. An apparatus comprising:
signal control circuitry configured and arranged to provide a reference clock signal carrying pseudo-random phase noise and as derived from an application clock signal and pseudo-random noise;
a phase-locked loop (PLL) including a phase detector being configured and arranged to, responsive to the reference clock signal, provide an output signal that is related to the phase of the reference clock signal; and
a correlation circuit configured and arranged to self-test the PLL by cross-correlating a signal corresponding to the output signal from the phase detector with the pseudo-random noise and, in response, by assessing results of the cross-correlation relative to a known threshold indicative of a performance level of the PLL, the correlation circuit including at least one summing circuit and a filter circuit configured and arranged to derive a PLL impulse response from a difference between the cross-correlation result between a phase error signal and the pseudo-random noise and an auto-correlation of the pseudo-random noise.

2. The apparatus of claim 1, wherein the PLL is configured and arranged to process an application signal while the PLL is concurrently providing the output signal related to the phase of the reference clock signal that is phase modulated by the pseudo-random noise.

3. The apparatus of claim 1, wherein the signal control circuitry includes:
a signal delay circuit; and
a signal-delay control circuit configured and arranged to, responsive to a control signal carrying the pseudo-random noise and the application clock signal, pass one of at least two input signals as the reference clock signal that is phase modulated by the pseudo-random noise, wherein the at least two input signals are derived from the application clock signal and include at least one input signal being delayed relative to the other of the at least two input signals via the signal delay circuit.

4. The apparatus of claim 3, wherein the signal delay circuit is integrated with the signal-delay control circuit.

5. The apparatus of claim 3, wherein the signal delay circuit and the signal-delay control circuit are separate, the signal delay circuit being configured and arranged to provide a delayed clock signal, relative to the application clock signal, to the signal-delay control circuit, and the signal-delay control circuit being further configured and arranged to pass the one of the at least two input signals derived from one of the application clock and the delayed clock signal.

6. The apparatus of claim 3, further including a variable delay line circuit that integrates the signal delay circuit and the signal-delay control circuit.

7. The apparatus of claim 1, wherein the PLL further includes:
a loop filter configured and arranged to filter the phase error signal as output by the phase detector, the phase error signal being proportional to a phase difference of the reference clock signal and a feedback signal from the PLL;
an oscillator configured and arranged to provide an output responsive to the filtered phase error signal; and
a feedback loop, including a feedback divider circuit, configured and arranged to provide the feedback signal to the phase detector responsive to the output of the oscillator.

8. The apparatus of claim 1, further including noise mitigation circuitry configured and arranged to remove at least a portion of the pseudo-random phase noise from an output provided by the PLL using a cross-correlation of a previous signal corresponding to another output signal from the phase detector with another reference clock signal carrying pseudo-random phase noise.

9. The apparatus of claim 1, wherein the cross-correlation is obtained using a folding product of a phase error of the PLL and the pseudo-random noise.

10. The apparatus of claim 1, wherein the PLL impulse response is derived from a derived impulse response of a phase error from the cross-correlation of a difference between an input phase and an output phase and the pseudo-random noise.

11. The apparatus of claim 10, wherein the correlation circuit is further configured and arranged to assess the PLL impulse response by inverting the difference between the auto-correlation of the pseudo-random noise and the impulse response of the phase error.

12. The apparatus of claim 1, wherein the pseudo-random noise has a frequency spectrum and an amplitude that is configured to dither the application clock signal in order to perform at least one of avoiding idle tones and spreading a PLL output clock spectrum over a wider range for reducing Electromagnetic Interference.

13. The apparatus of claim 1, wherein the PLL includes an all-digital PLL (ADPLL) having a digital loop filter and the phase detector is further configured and arranged to provide a digital signal output.

14. A method comprising:
providing a reference clock signal carrying a pseudo-random phase noise and as derived from an application clock signal and pseudo-random noise;
providing a control signal carrying the pseudo-random noise;
using the control signal for passing one of at least two input signals as the reference clock signal that is carrying the pseudo-random phase noise, wherein the at least two input signals are derived from the application clock signal and include at least one input signal being delayed relative to the other of the at least two input signals;
responsive to the reference clock signal, providing an output signal that is related to the phase of the reference clock signal carrying the pseudo-random phase noise by a phase detector of a phase-locked loop (PLL) of an apparatus; and
self-testing the PLL by cross-correlating a signal corresponding to the output signal from the phase detector with the pseudo-random noise and, in response, by assessing results of the cross-correlation relative to a known threshold indicative of a performance level of the PLL.

15. The method of claim 14, wherein self-testing the PLL further includes:
calculating a phase margin using the cross-correlation result;
comparing the phase margin to the known threshold, the known threshold being indicative of at least one of a phase margin limit and a previously calculated phase margin; and
in response to the comparison being indicative of a circuit failure, performing an action based on the failure, the action being selected from the group consisting of providing an error message, rebooting the apparatus, powering the apparatus down, and a combination thereof.

16. The method of claim 14, further including removing at least a portion of the pseudo-random noise from the cross-correlation and, therefrom, determine a PLL impulse response.

17. The method of claim 14, further including determining whether the PLL is locked using the output signal from the PLL and an input signal, and self-testing the PLL in response to the PLL being locked.

18. The method of claim 14, further including determining a phase transfer function from the cross-correlation and trimming at least one component of the PLL responsive to the determined phase transfer function.

19. An apparatus comprising:
signal control circuitry configured and arranged to provide a reference clock signal carrying pseudo-random phase noise and as derived from an application clock signal and pseudo-random noise, the signal control circuitry includes:
a signal delay circuit; and
a signal-delay control circuit configured and arranged to, responsive to a control signal carrying the pseudo-random noise and the application clock signal, pass one of at least two input signals as the reference clock signal that is phase modulated by the pseudo-random noise, wherein the at least two input signals are derived from the application clock signal and include at least one input signal being delayed relative to the other of the at least two input signals via the signal delay circuit;
a phase-locked loop (PLL) including a phase detector being configured and arranged to, responsive to the reference clock signal, provide an output signal that is related to the phase of the reference clock signal; and
a correlation circuit configured and arranged to self-test the PLL by cross-correlating a signal corresponding to the output signal from the phase detector with the pseudo-random noise and, in response, by assessing results of the cross-correlation relative to a known threshold indicative of a performance level of the PLL.

20. The apparatus of claim 19, wherein the PLL is configured and arranged to process an application signal while the PLL is concurrently providing the output signal related to the phase of the reference clock signal that is phase modulated by the pseudo-random noise.

* * * * *